(12) United States Patent
Wu et al.

(10) Patent No.: US 10,276,587 B2
(45) Date of Patent: Apr. 30, 2019

(54) NVM MEMORY HKMG INTEGRATION TECHNOLOGY

(71) Applicant: Taiwan Semiconductor Manufacturing Co., Ltd., Hsin-Chu (TW)

(72) Inventors: Wei Cheng Wu, Zhubei (TW); Chien-Hung Chang, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 28 days.

(21) Appl. No.: 15/167,070

(22) Filed: May 27, 2016

(65) Prior Publication Data
US 2017/0345841 A1    Nov. 30, 2017

(51) Int. Cl.
| | | |
|---|---|---|
| H01L 27/11573 | (2017.01) |
| H01L 29/423 | (2006.01) |
| H01L 27/11568 | (2017.01) |
| H01L 29/51 | (2006.01) |
| H01L 29/66 | (2006.01) |
| H01L 21/28 | (2006.01) |
| H01L 27/11536 | (2017.01) |

(52) U.S. Cl.
CPC .. *H01L 27/11573* (2013.01); *H01L 21/28273* (2013.01); *H01L 21/28282* (2013.01); *H01L 27/11536* (2013.01); *H01L 27/11568* (2013.01); *H01L 29/42328* (2013.01); *H01L 29/42344* (2013.01); *H01L 29/513* (2013.01); *H01L 29/517* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 6,043,157 A | * | 3/2000 | Gardner | H01L 21/82345 257/202 |
| 2010/0038692 A1 | * | 2/2010 | Chuang | H01L 27/0629 257/298 |
| 2011/0070725 A1 | * | 3/2011 | Power | H01L 21/28273 438/591 |
| 2013/0052803 A1 | * | 2/2013 | Roizin | H01L 21/28273 438/478 |

(Continued)

*Primary Examiner* — Matthew L Reames
*Assistant Examiner* — Steven B Gauthier
(74) *Attorney, Agent, or Firm* — Eschweiler & Potashnik, LLC

(57) ABSTRACT

The present disclosure relates to a method of forming an integrated circuit (IC). In some embodiments, a substrate is provided comprising a memory region and a logic region. A sacrificial logic gate electrode is formed within the logic region together with a control gate electrode or a select gate electrode within the memory region by patterning a control gate layer or a select gate layer. A first inter-layer dielectric layer is formed between the sacrificial logic gate electrode and the control gate electrode or the select gate electrode. A hard mask is formed over the first inter-layer dielectric layer to cover the memory region and to expose the sacrificial logic gate electrode within the logic region. The sacrificial logic gate electrode is replaced with a high-k gate dielectric layer and a metal layer to form a metal gate electrode within the logic region.

20 Claims, 19 Drawing Sheets

(56) References Cited

U.S. PATENT DOCUMENTS

| | | | | |
|---|---|---|---|---|
| 2014/0302646 A1* | 10/2014 | Hirano | ............ | H01L 21/823456 438/197 |
| 2015/0137206 A1* | 5/2015 | Liu | ................... | H01L 29/66825 257/316 |
| 2015/0140800 A1* | 5/2015 | Cheng | ............... | H01L 21/28273 438/596 |

* cited by examiner

NVM MEMORY HKMG INTEGRATION TECHNOLOGY

BACKGROUND

Embedded memory is a technology that is used in the semiconductor industry to improve performance of an integrated circuit (IC). Embedded memory is a non-stand-alone memory, which is integrated on the same chip with a logic core and which supports the logic core to accomplish an intended function. High-performance embedded memory enables high-speed and wide bus-width capability, which limits or eliminates inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
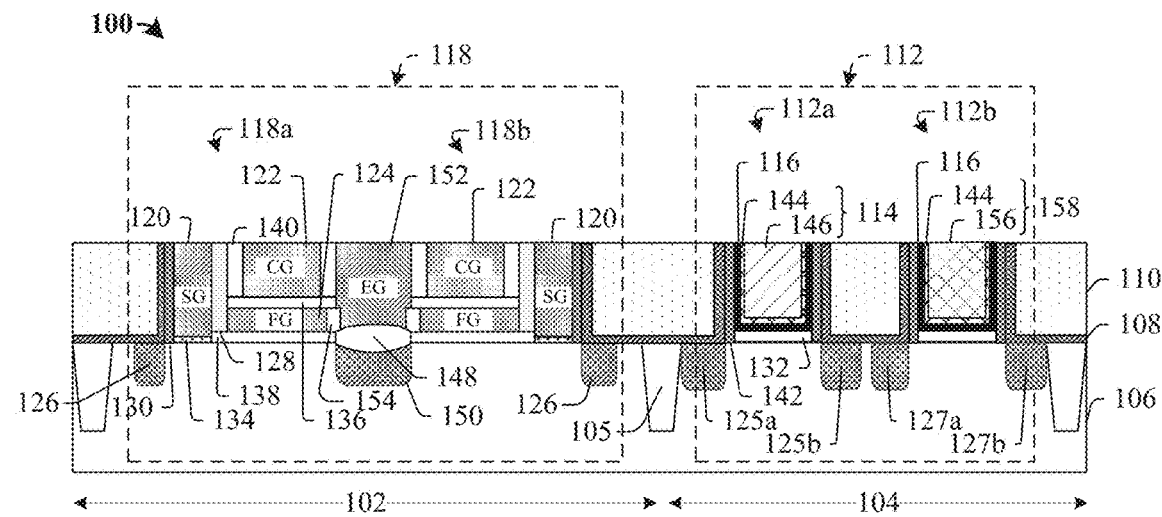
FIG. 1 illustrates a cross-sectional view of some embodiments of an integrated circuit (IC) comprising a high-k metal gate (HKMG) non-volatile memory (NVM) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the semiconductor industry has begun to integrate logic devices and memory devices on a single semiconductor chip. This integration improves performance over solutions where two separate chips—one for memory and another for logic—cause undesirable delays due to wires or leads that connect the two chips. In addition, the processing costs for integrating memory and logic devices on the same semiconductor chip are reduced due to the sharing of specific process steps used to fabricate both types of devices. One common type of embedded memory is embedded flash memory, which may include an array of flash memory cells. A flash memory cell comprises a charge trapping component, such as a floating gate or a charge trapping layer, used to store charges (e.g. electrons/holes) regardless whether the power is applied. A pair of control gate and select gate is disposed one next to another for write/read of the flash memory cell.

High-k metal gate (HKMG) technology has also become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power.

The present disclosure relates to an integrated circuit (IC) that comprises a small scale and high performance non-volatile memory (NVM) device integrated with a high-k metal gate (HKMG) logic device, and a method of formation. In some embodiments, the integrated circuit comprises a memory region and an adjacent logic region. The logic region comprises a logic device including a metal gate electrode having bottom and sidewall surfaces covered by a high-k gate dielectric layer and disposed over a logic gate dielectric. The memory region comprises a non-volatile memory (NVM) device including a control gate electrode and a select gate electrode disposed between two neighboring source/drain regions over a substrate. In some embodiments, the control gate electrode and the select gate electrode comprise polysilicon, and are separated from the substrate by a continuous memory gate dielectric. By integrating the HKMG logic device and the NVM memory device, manufacturing processes are simplified such that further scaling becomes possible in emerging technology nodes.

FIG. 1 illustrates a cross-sectional view of some embodiments of an IC 100 comprising a HKMG NVM device including a semiconductor memory device integrated with a HKMG logic device. The IC 100 is disposed on a substrate 106 that includes a memory region 102 and a logic region 104, which are isolated by an isolation structure 105, such as a shallow trench isolation (STI) structure or a deep trench isolation (DTI) structure. The logic region 104 comprises a logic device 112, which includes a first transistor 112a and a second transistor 112b; while the memory region 102 includes a non-volatile memory device 118, which includes a first memory cell 118a and a second memory cell 118b. Though FIG. 1 only illustrates two transistors in the logic region 104 and only two memory cells in the memory region 102, it will be appreciated that the disclosure can be extended to include number of transistors in the logic region 104 and any number of memory cells in the memory region 102.

In some embodiments, the first transistor 112a (e.g. a NMOS transistor) comprises a first metal gate electrode 114 and the second transistor 112b (e.g. a PMOS transistor) comprises a second metal gate electrode 158. The first metal gate electrode 114 is disposed between two source/drain regions 125a, 125b; and the second metal gate electrode 158 is disposed between two source/drain regions 127a, 127b. The first and second metal gate electrodes 114, 158 have their bottom and sidewall surfaces covered by a high-k gate dielectric layer 116 and are disposed over a logic gate dielectric 132. By making use of HKMG structure in transistors of the logic device 112, transistor capacitance (and thereby drive current) is increased and gate leakage and threshold voltage are reduced.

In some embodiments, the first metal gate electrode 114 comprises a core metal layer 146 separated from the high-k gate dielectric layer 116 by a barrier layer 144. The barrier layer 144 protects the core metal layer 146 from diffusing into surrounding materials. In some embodiments, the core metal layer 146 comprises copper (Cu), tungsten (W) or aluminum (Al), or their alloys, for example; and the barrier layer 144 can comprise metal materials such as titanium (Ti), tantalum (Ta), zirconium (Zr), or their alloys, for example. In some embodiments, the high-k gate dielectric layer 116 comprises hafnium oxide (HfO), hafnium silicon oxide (HfSiO), hafnium aluminum oxide (HfAlO), or hafnium tantalum oxide (HMO), for example.

In some embodiments, the second metal gate electrode 158 also comprises a core metal layer 156 separated from the high-k gate dielectric layer 116 by the barrier layer 144. However, to alter the work functions of the metal gates, the second metal gate electrode 158 is made of a different metal than the first metal gate electrode 114. The second metal gate electrode 158 can also have a different thickness from the first metal gate electrode 114. In some embodiments, the barrier layer 144 can be the same material and/or thickness for the second metal gate electrode 158 as for the first metal gate electrode 114.

In some embodiments, the memory region 102 includes a common source/drain region 150 which is shared by the first and second memory cells 118a, 118b; while individual source/drain regions 126 are disposed about outer edges of the first and second memory cells 118a, 118b. A pair of control gate electrodes 122 are separated from the substrate 106 by corresponding floating gates 124. A pair of select gate electrodes 120 are disposed at opposite sides of the pair of control gate electrodes 122 and separated from the substrate 106 by a select gate dielectric 134. Thus, a control gate electrode 122 and corresponding select gate electrode 120 on one side of the common source 150 establish a first control gate/select gate pair; while a control gate electrode 122 and corresponding select gate electrode 120 on the other side of the common source 150 establish a second control gate/select gate pair.

The floating gates 124 are disposed on a floating gate dielectric 138 and have upper surfaces covered by an inter-poly dielectric 136. In some embodiments, a control gate spacer 140 can be disposed on the inter-poly dielectric 136 and along sidewalls of the pair of control gate electrodes 122. A floating gate spacer 128 can be disposed on the floating gate dielectric 138 and along outer sidewalls of the pair of the floating gates 124. In some embodiments, the floating gate spacer 128 may comprise one or more layers of oxide or nitride. For example, the floating gate spacer 128 may include a multi-layer structure such as an ONO structure having a nitride layer sandwiched between two oxide layers, or a NON structure having an oxide layer sandwiched between two nitride layers. The floating gate dielectric 138 and the inter-poly dielectric 136 can have thicknesses greater than a thickness of the select gate dielectric 134. In some embodiments, the control gate electrodes 122 and the select gate electrodes 120 have cuboid shapes, which have planar upper surfaces coplanar with an upper surface of the metal gate electrode 114.

An erase gate electrode 152 can be disposed between inner sides of the pair of the floating gates 124 over the common source 150. A common source/drain dielectric 148 can separate the erase gate 152 from the common source 150, and a tunneling dielectric layer 154 can separate the erase gate 152 from the floating gates 124. The erase gate electrode 152 may have a planar upper surface coplanar with an upper surface of the control gate electrode 122 and the metal gate electrode 114.

In some embodiments, the select gate electrode 120 and the control gate electrode 122 comprise a different material than the metal gate electrode 114. For example, in some embodiments, the select gate electrode 120 and the control gate electrode 122 may comprise doped polysilicon. In some embodiments, the select gate electrode 120 may be connected to a word line, which is configured to control access of the NVM device 118. During operation, charges (e.g. electrons) can be trapped in the floating gate 124, setting a NVM memory cell to one logic state (e.g. logical "0"), and can be removed from the floating gate 124 by the erase gate electrode 152 to change the NVM memory cell to another logic state (e.g. logical "1").

In some embodiments, a sidewall spacer 130 is disposed on an upper surface of the substrate 106 and along outer sidewalls of the pair of the select gate electrodes 120. The sidewall spacer 130 is also disposed along sidewalls of the metal gate electrode 114 and the logic gate dielectric 132. In some embodiments, the sidewall spacer 130 and the sidewall spacer 130 can be made of silicon nitride or silicon oxide. The sidewall spacer 130 and the sidewall spacer 130 may have upper surfaces that are aligned with upper surfaces of the metal gate electrode 114, the select gate electrode 120, and the control gate electrode 122. The logic region 104 and the memory region 102 may be laterally separated from one another by an inter-layer dielectric layer 110 arranged over the substrate 106. In some embodiments, the inter-layer dielectric layer 110 may comprise a low-k dielectric layer, an ultra low-k dielectric layer, an extreme low-k dielectric layer, and/or a silicon dioxide layer. Though not shown in FIG. 1, in some embodiments, one or more of the plurality of contacts may extend through the inter-layer dielectric layer 110 and be coupled to the source/drain regions 126. In some embodiments, the plurality of contacts may comprise a metal such as tungsten, copper, and/or aluminum.

In some embodiments, a contact etch stop layer 108 separates the inter-layer dielectric layer 110 from the logic device 112, the NVM device 118 and the substrate 106. The contact etch stop layer 108 may have a 'U' shaped structure and line the logic device 112, the NVM device 118 and an upper surface of the substrate 106. The contact etch stop layer 108 may comprise a planar lateral component connecting a first vertical component abutting the sidewall spacer 130 arranged along a side of the NVM device 118 and a second vertical component abutting the sidewall spacer 130 arranged along a side of the logic device 112. Using the inter-layer dielectric layer 110 and the contact etch stop layer 108 to isolate the logic device 112 and the NVM device 118 allows for high device density to be achieved.

Figure 2:
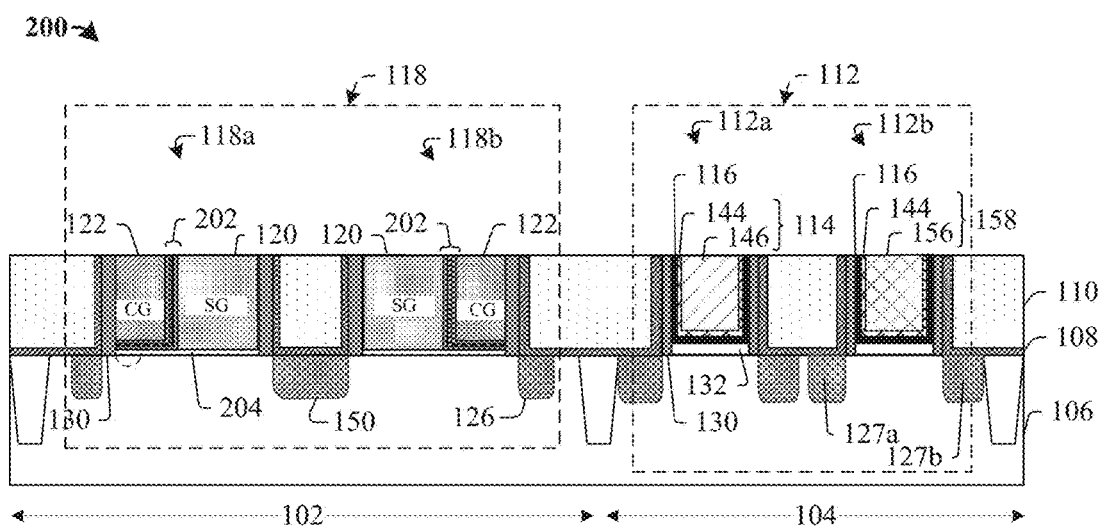
FIG. 2 illustrates a cross-sectional view of some additional embodiments of an IC comprising a HKMG NVM device.

FIG. 2 illustrates a cross-sectional view of some alternative embodiments of an IC 200 comprising a HKMG NVM device including a semiconductor memory device integrated with a HKMG logic device. The IC 200 comprises a memory region 102 and a logic region 104 disposed adjacent to the memory region 102. The logic region 104 comprises a logic device 112 disposed over a substrate 106, which includes a first transistor 112a and a second transistor 112b. In some embodiments, the logic region 104 comprises a first metal gate electrode 114 having bottom and sidewall surfaces lined by a high-k gate dielectric layer 116 and disposed over a logic gate dielectric 132. In some embodiments, the first metal gate electrode 114 may comprise a core metal layer 146 separated from the high-k gate dielectric layer 116 by a barrier layer 144, which protects the core metal layer 146 from contamination. By making use of HKMG structure in transistors of the logic device 112, transistor capacitance (and thereby drive current) is increased and gate leakage and threshold voltage are reduced.

In some embodiments, the memory region 102 comprises a non-volatile memory (NVM) device 118 including a pair of memory cells 118a, 118b that reside over the substrate 106. Each of the memory cells 118a, 118b comprises a gate structure that is arranged over a channel region between source/drain regions 126. A common source/drain region 150 is shared by the pair of memory cells 118a, 118b. The gate structure of the memory cell (e.g. 118a, 118b) comprises a pair of a select gate electrode 120 and a control gate electrode 122, and have bottom surfaces of both the select gate electrode 120 and the control gate electrode 122 separated from an upper surface of the substrate 106 by a memory gate dielectric 204. A charge trapping layer 202 is arranged between neighboring sidewalls of the select gate electrode 120 and the control gate electrode 122, and extends under the control gate electrode 122. In some embodiments, the select gate electrode 120 and the control gate electrode 122 have cuboid shapes with coplanar top surfaces. In some embodiments, the select gate electrode 120 and the control gate electrode 122 comprise doped polysilicon; however, in other embodiments the select gate electrode 120 and the control gate electrode 122 can be made by other conductive materials such as metal, for example. In some embodiments, the charge trapping layer 202 comprises a first oxide layer, a nitride layer, and a second oxide layer or, which can be referred to as an oxide-nitride-oxide (ONO) structure. In some other embodiments, the charge trapping layer 202 comprises a first oxide layer, a layer of sphere-like silicon dots, and a second oxide layer. During operation of the memory cell, the first and/or second oxide layers are structured to promote electron tunneling to and from the nitride layer or the silicon dots layer, such that the nitride layer or the silicon dots layer can retain trapped electrons that alter the threshold voltage of the cell in a manner that corresponds to a data state stored in the cell.

In some embodiments, a conformal contact etch stop layer 108 and an inter-layer dielectric layer 110 are disposed between the memory region 102 and the logic region 104 for isolation. The contact etch stop layer 108 may have a 'U' shaped structure and line neighboring sidewalls of the logic device 112, the NVM device 118 and an upper surface of the substrate 106. The contact etch stop layer 108 may comprise a planar lateral component connecting a first vertical component abutting a first portion of a sidewall spacer 130 arranged along a side of the control gate electrode 122 and a second vertical component abutting a second portion of sidewall spacer 130 arranged along a side of the metal gate electrode 114. Using the inter-layer dielectric layer 110 and the contact etch stop layer 108 to isolate the logic device 112 and the NVM device 118 allows for high device density to be achieved.

Figure 3:
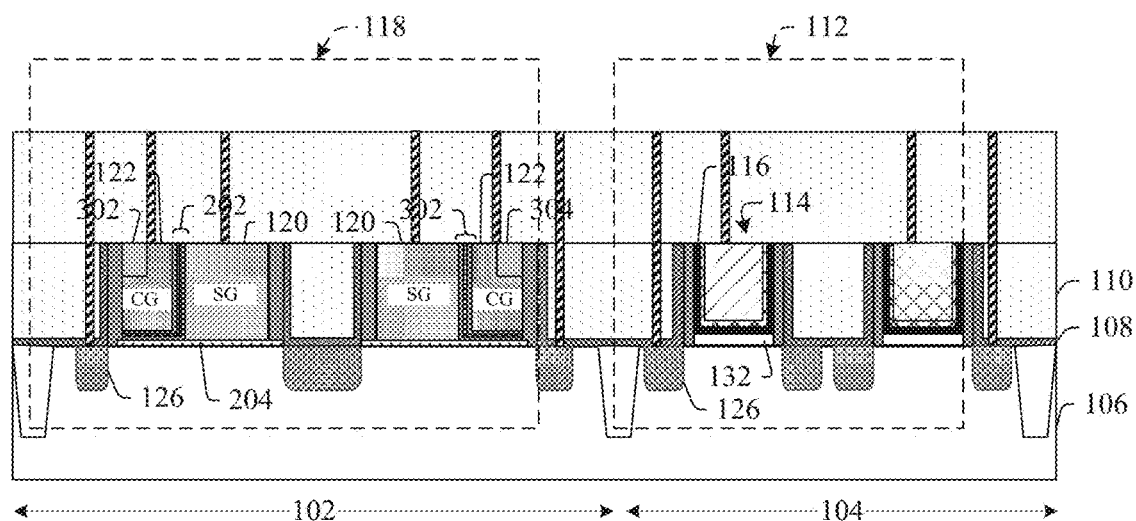
FIG. 3 illustrates a cross-sectional view of some additional embodiments of an IC comprising a HKMG NVM device.

FIG. 3 illustrates a cross-sectional view of some alternative embodiments of an IC 300 comprising a HKMG NVM device including a semiconductor memory device integrated with a HKMG logic device. As some alternative embodiments of the HKMG NVM devices shown in FIG. 1 and FIG. 2, the IC 300 comprises a memory region 102 having a select gate electrode 120 with a cuboid shape and a control gate electrode 122 with an 'L' shape. The select gate electrode 120 and the control gate electrode 122 are disposed over a memory gate dielectric 204. In some embodiments, a cap spacer 302 is disposed along a ledge portion of the control gate electrode 122 locates at one side of the control gate electrode 122 opposite to the other side where the select gate electrode 120 locates. A charge trapping layer 202 is arranged between neighboring sidewalls of the select gate electrode 120 and the control gate electrode 122, and extends under the control gate electrode 122. In some embodiments, the select gate electrode 120 and the control gate electrode 122 comprise doped polysilicon. In other embodiments the select gate electrode 120 and the control gate electrode 122 can be made by other conductive materials such as metal, for example.

A logic region 104 adjacent to the memory region 102 comprises a transistor with a first metal gate electrode 114 lined by a high-k gate dielectric layer 116 and disposed over a logic gate dielectric 132. In some embodiments, a conformal contact etch stop layer 108 and an inter-layer dielectric layer 110 are disposed between the memory region 102 and the logic region 104 for isolation. Additional contact etch stop layers and inter-layer dielectric layers can be disposed over the inter-layer dielectric layer 110. Contacts can be disposed through the inter-layer dielectric layers to reach source/drain regions 126, the control gate electrodes 122, the select gate electrodes 120, and the first metal gate electrode 114. In some embodiments, the contacts may comprise tungsten (W), for example.

FIGS. 4-15 illustrate a series of cross-sectional views 400-1500 of some embodiments of a method for manufacturing an IC comprising a HKMG NVM device.

Figure 4:
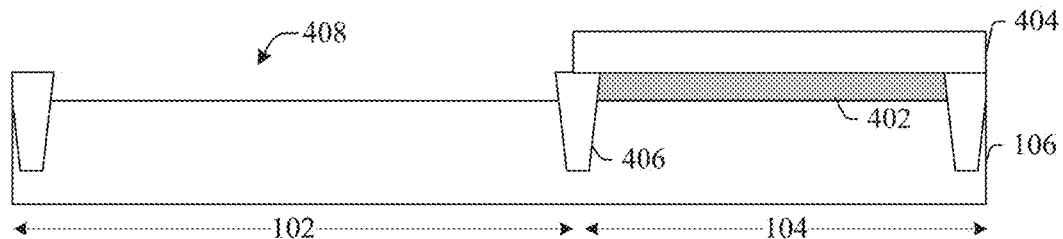
FIGS. 4-15 illustrate a series of cross-sectional views of some embodiments of a method for manufacturing an IC comprising a HKMG NVM device.

As shown in cross-sectional view 400 of FIG. 4, a substrate 106 is provided including a memory region 102 and an adjacent logic region 104. A protection layer 402 is formed within the logic region 104 over the substrate 106. In some embodiments, the protection layer 402 is formed by depositing the protection layer over the substrate 106 followed by patterning the protection layer to form an opening within the memory region 102. A mask layer 404 (e.g. a photoresist mask) can be formed to protect the protection layer within the logic region 104 during the patterning. In some embodiments, the protection layer 402 is formed to have an upper surface aligned with an upper surface of an isolation structure 406 between the memory region 102 and the logic region 104, as a result of a planarization process.

In some embodiments, the isolation structure 406 comprises a deep trench disposed within the substrate 106 and filled with a dielectric material. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith.

Figure 5:
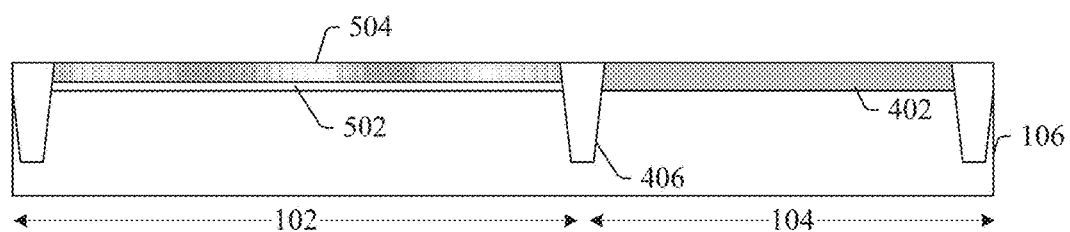

As shown in cross-sectional view 500 of FIG. 5, a memory gate dielectric layer 502 and a floating gate layer 504 are formed over the substrate 106 within the memory region 102. In some embodiments, the memory gate dielectric layer 502 comprises silicon dioxide and the floating gate layer 504 comprises doped polysilicon. In some embodiments, the memory gate dielectric layer 502 and the floating gate layer 504 are also formed over the protection layer 402 within the logic region 104 and then removed by a planarization process, such as a chemical-mechanical polishing (CMP) process. The protection layer 402 may be then removed to expose an upper surface of the substrate 106 within the logic region 104. In some embodiments, the memory gate dielectric layer 502 and the floating gate layer 504 are formed by using a deposition technique (e.g., PVD, CVD, PE-CVD, ALD, etc.).

Figure 6:
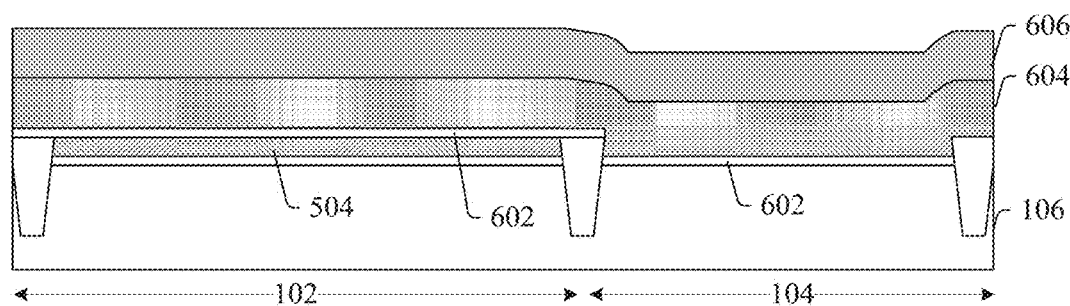

As shown in cross-sectional view 600 of FIG. 6, an inter-poly dielectric layer 602, a control gate layer 604 and a hard mask layer 606 are subsequently formed over the floating gate layer 504 within the memory region 102 and over the substrate 106 within the logic region 104. In some embodiments, the inter-poly dielectric layer 602, the control gate layer 604, and the hard mask layer 606 are formed by using a deposition technique (e.g., PVD, CVD, PE-CVD, ALD, etc.).

Figure 7:
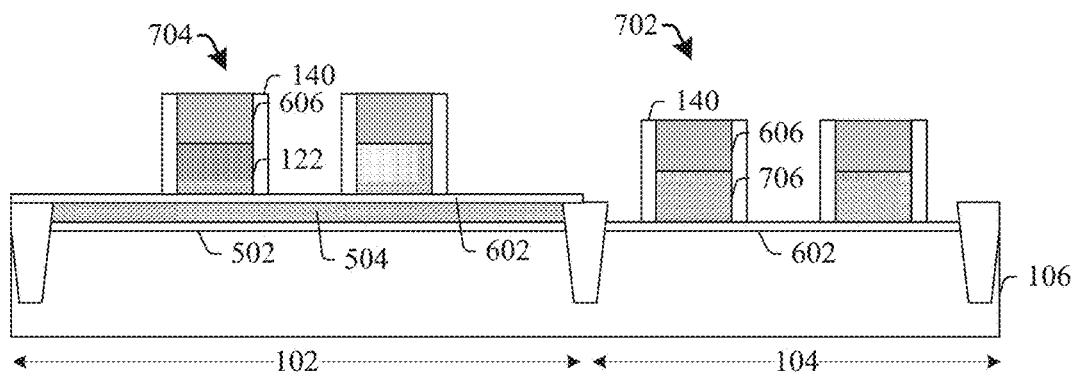

As shown in cross-sectional view 700 of FIG. 7, the hard mask layer 606 and the control gate layer 604 (shown in FIG. 6) are patterned to form a sacrificial logic gate stack 702 within the logic region 104 and a control gate stack 704 within the memory region 102. The sacrificial logic gate stack 702 may comprise a sacrificial select gate layer 706, which is a portion of the control gate layer 604 of FIG. 6 and the overlying hard mask layer 606. The control gate stack 704 may comprise a control gate electrode 122, which is a portion of the control gate layer 604 of FIG. 6, formed under the hard mask layer 606 and on the inter-poly dielectric layer 602. In some embodiments, the sacrificial logic gate stack 702 and the control gate stack 704 are formed by performing a photolithography process followed by one or more subsequent etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.). The etching processes may stop on the inter-poly dielectric layer 602 within the memory region 102, and may stop on the inter-poly dielectric layer 602 within the logic region 104. In some embodiments, a control gate spacer 140 is subsequently formed along sidewalls of the sacrificial logic gate stack 702 and the control gate stack 704. In some embodiments, the control gate spacer 140 is formed by depositing a conformal dielectric layer followed by an etch process, to remove a lateral portion of the dielectric layer and to leave a vertical portion along the sidewalls of the sacrificial logic gate stack 702 and the control gate stack 704.

Figure 8:
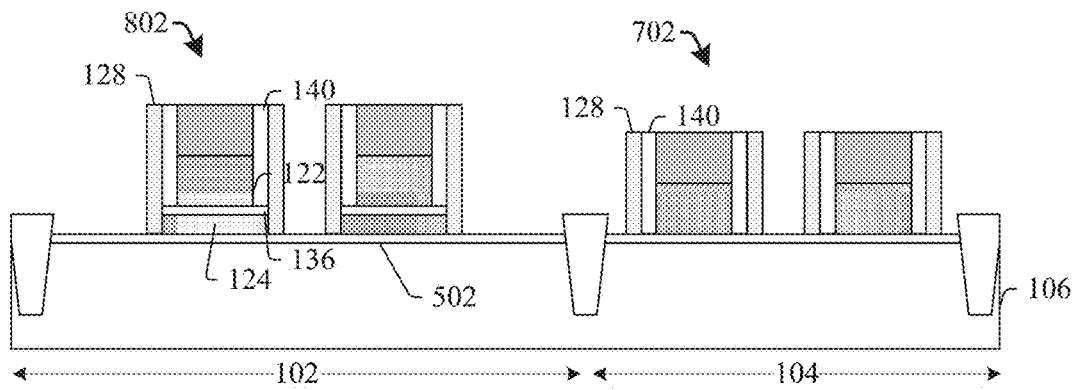

As shown in cross-sectional view 800 of FIG. 8, the inter-poly dielectric layer 602 and the floating gate layer 504 within the memory region 102 are patterned to form a memory gate stack 802 together with the control gate stack 704 (shown in FIG. 7). In some embodiments, the inter-poly dielectric layer 602 and the floating gate layer 504 are patterned self-aligned, i.e., according to the control gate stack 704 and the control gate spacer 140 as a "mask layer". In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.). The etching processes may stop on the memory gate dielectric layer 502. In some embodiments, a floating gate spacer 128 is subsequently formed along sidewalls of the sacrificial logic gate stack 702 and the memory gate stack 802. In some embodiments, the floating gate spacer 128 may comprise one or more layers of oxide or nitride.

Figure 9:
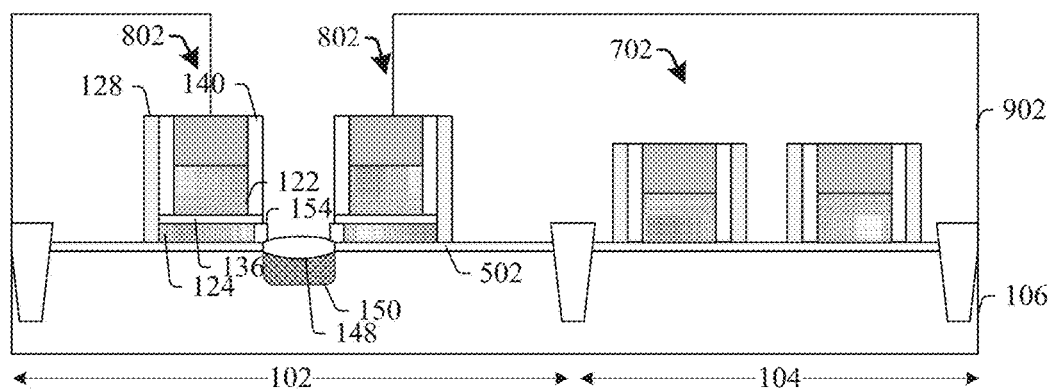

As shown in cross-sectional view 900 of FIG. 9, a common source/drain region 150 is formed between opposing sides of the memory gate stacks 802 within the substrate 106. A portion of the floating gate spacer 128 between the opposing sides of the memory gate stacks 802 is removed with a mask 902 (e.g., a photoresist mask) in place, and a tunneling dielectric layer 154 is formed along the opposing sides of the floating gates 124. In some embodiments, the tunneling dielectric layer 154 is formed by thermal oxidation, wherein an oxidizing agent is forced to diffuse into the floating gates 124. A common source/drain dielectric 148 can be formed on the common source/drain region 150.

Figure 10:
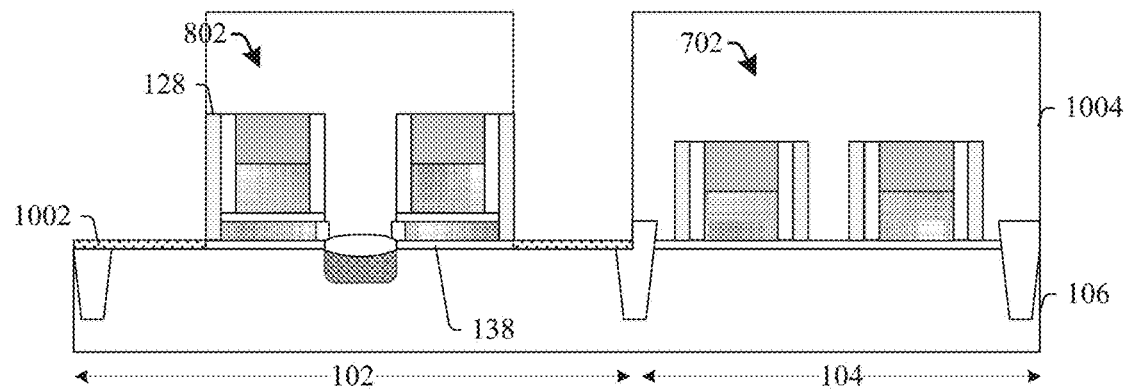

As shown in cross-sectional view 1000 of FIG. 10, the memory gate dielectric layer 502 is patterned to form a floating gate dielectric 138 with a mask 1004 (e.g., a photoresist mask) in place. A select gate dielectric layer 1002 is formed on the substrate 106 aside of the floating gate dielectric 138. In some embodiments, the select gate dielectric layer 1002 is formed to have a thickness smaller than that of the floating gate dielectric 138.

Figure 11:
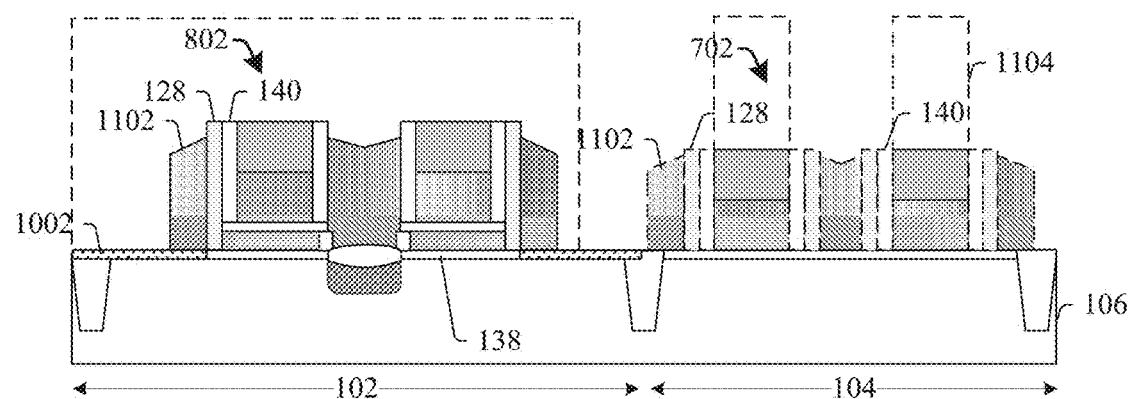

As shown in cross-sectional view 1100 of FIG. 11, a conductive layer 1102 is formed along sides of the memory gate stacks 802 and the sacrificial logic gate stacks 702. In some embodiments, the conductive layer 1102 is formed by depositing the conductive layer conformally over the workpiece before performing an etch process, to remove a lateral portion of the conductive layer and to leave a vertical portion along the sidewalls of memory gate stacks 802 and the sacrificial logic gate stacks 702. Then the conductive layer 1102 within the logic region 104 is selectively removed with a mask 1104 (e.g., a photoresist mask) in place. Portions of the control gate spacer 140 and the floating gate spacer 128 within the logic region 104 may be also removed.

Figure 12:
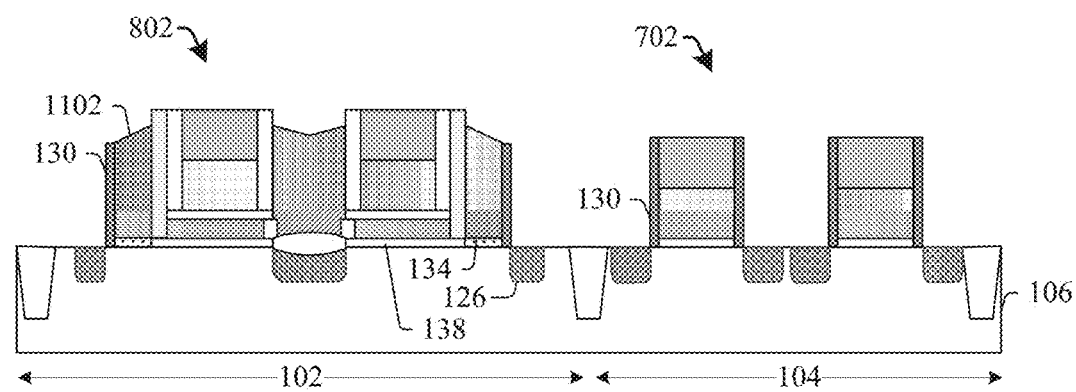

As shown in cross-sectional view 1200 of FIG. 12, a sidewall spacer 130 is formed along the conductive layer 1102 within the memory region 102 and along the sacrificial logic gate stacks 702 within the logic region 104. In some embodiments, the sidewall spacer 130 is formed by depositing a conformal dielectric layer followed by an etch process, to remove a lateral portion of the dielectric layer and to leave a vertical portion along sidewalls of the conductive layer 1102 and the sacrificial logic gate stacks 702. In some embodiments, the sidewall spacer 130 may comprise an oxide (e.g., $SiO_2$) or a nitride (e.g., SiN) formed by a deposition process. The sidewall spacer 130 may be formed directly on an upper surface of the substrate 106. Source/drain regions 126 can subsequently formed within the memory region 102 and within the logic region 104, respectively. In some embodiments, the source/drain regions 126 may be formed by an implantation process that selectively implants the substrate 106 with a dopant, such as boron (B) or phosphorous (P), for example. In some other embodiments, the source/drain regions 126 may be formed by performing an etch process to form a trench followed by an epitaxial growth process. In such embodiments, the source/drain regions 126 may have a raised portion that is higher than the upper surface of the substrate 106. In some embodiments, a salicidation process is performed to form a silicide layer (not shown in the figure) on upper surfaces of the source/drain regions 126. In some embodiments, the salicidation process may be performed by depositing a nickel layer and then performing a thermal annealing process (e.g., a rapid thermal anneal).

Figure 13:
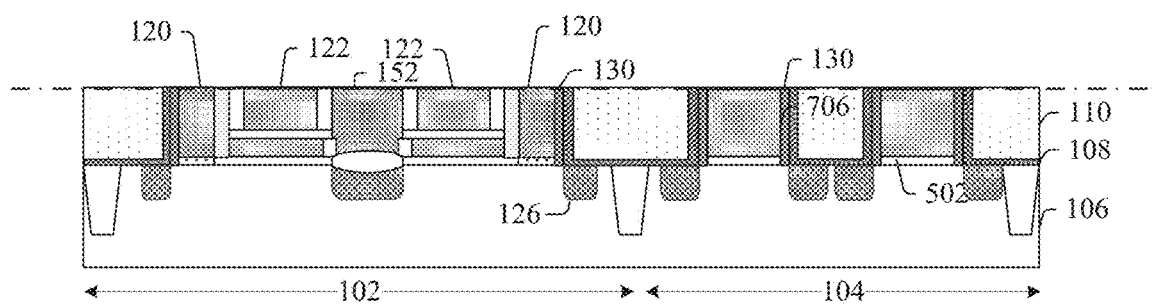

As shown in cross-sectional view 1300 of FIG. 13, a conformal contact etch stop layer 108 is formed over the source/drain regions 126 and extends along the sidewall spacer 130. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. In some embodiments, the first planarization process may comprise a chemical mechanical polishing (CMP) process. In some embodiments, the first inter-layer dielectric layer 110 may comprise a low-k dielectric layer, formed by way of a deposition process (e.g., CVD, PVD, etc.). The sacrificial select gate layer 706 may be exposed after the first planarization process. An erase gate electrode 152 can be formed between opposing sides of control gate electrodes 122 and select gate electrodes 120 can be formed at opposite sides of the control gate electrodes 122. The erase gate electrode 152 and the select gate electrodes 120 can be made from the conductive layer 1102 shown in FIG. 12.

Figure 14:
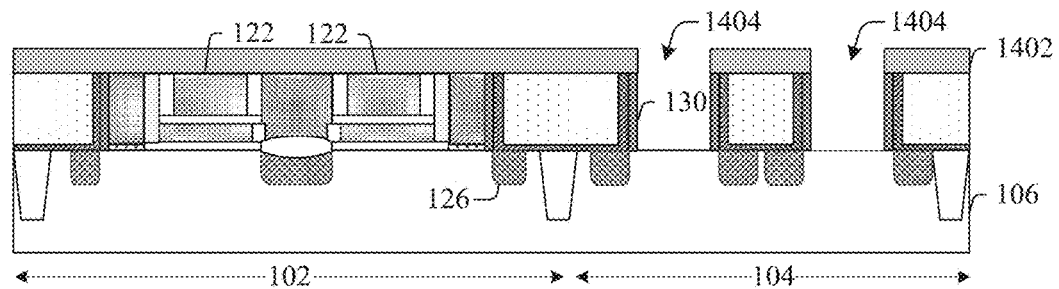

As shown in cross-sectional view 1400 of FIG. 14, a hard mask 1402 is formed to cover the memory region 102 and to expose sacrificial logic gate stacks within the logic region 104. The sacrificial select gate layer 706 (shown in FIG. 13) is removed, resulting in the formation of trenches 1404 between the sidewall spacer 130.

Figure 15:
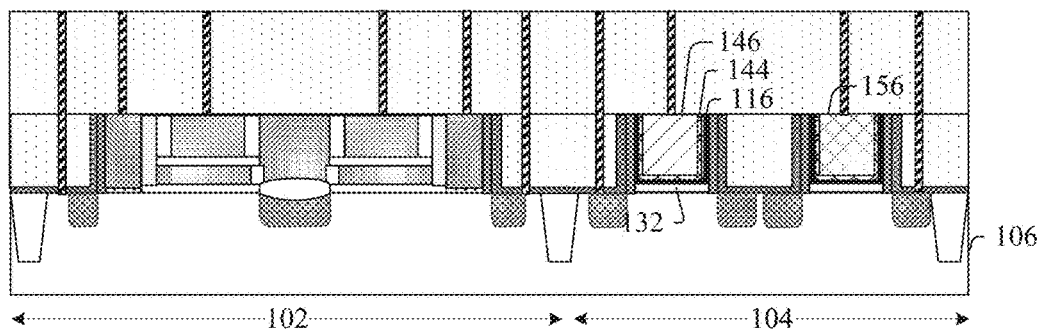

As shown in cross-sectional view 1500 of FIG. 15, a high-k gate dielectric layer 116, a barrier layer 144 and metal gate materials (e.g. 146, 156) are formed over the first inter-layer dielectric layer 110 and/or the hard mask 1402 and filled into the trenches 1404 of FIG. 14 through one or more deposition processes (e.g., chemical vapor deposition, physical vapor deposition, etc.). The barrier layer 144 can be formed in conformal and comprise metal materials such as titanium (Ti), tantalum (Ta), zirconium (Zr), or their alloys, for example. A series of deposition and etching processes can be performed that form different metal compositions within the trenches 1404 for different devices or different components of the same devices, to achieve desired work functions. In some embodiments, the memory gate dielectric layer 502 within the sacrificial logic gate stacks (shown in FIG. 13) can be removed and replaced by a logic gate dielectric 132. Contacts can be formed within a second inter-layer dielectric layer overlying the first inter-layer dielectric layer 110. The contacts may be formed by selectively etching the second inter-layer dielectric layer to form openings (e.g. with a patterned photoresist mask in place), and by subsequently depositing a conductive material within the openings. In some embodiments, the conductive material may comprise tungsten (W) or titanium nitride (TiN), for example.

Figure 16:
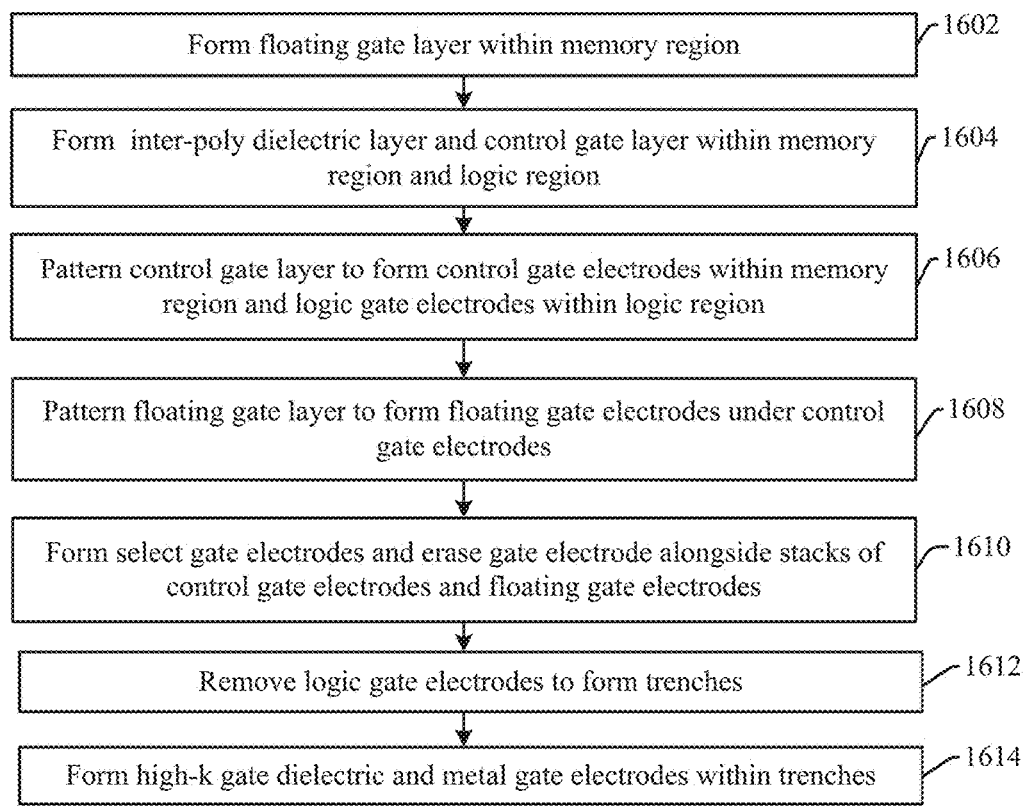
FIG. 16 illustrates a flow diagram of some embodiments of a method for manufacturing an IC comprising a HKMG NVM device.

FIG. 16 illustrates a flow diagram of some embodiments of a method 1600 for manufacturing an IC comprising a HKMG NVM device.

Although method 1600 is described in relation to FIGS. 4-15, it will be appreciated that the method 1600 is not limited to such structures, but instead may stand alone as a method independent of the structures. Furthermore, while the disclosed methods (e.g., method 1600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a memory gate dielectric layer and a floating gate layer are formed over a substrate within a memory region. A protective layer is formed within a logic region before forming the memory gate dielectric layer and the floating gate layer, such that an upper surface of the substrate within the logic region can be protected when patterning the memory gate dielectric layer and the floating gate layer. FIGS. 4-5 illustrate some embodiments of cross-sectional views 400, 500 corresponding to act 1602.

At 1604, an inter-poly dielectric layer and a control gate layer are formed within both the memory region and the logic region. FIG. 6 illustrates some embodiments of a cross-sectional view 600 corresponding to act 1604.

At 1606, the control gate layer is subsequently patterned to form a sacrificial logic gate electrode within the logic region and a control gate electrode within the memory region. A control gate spacer is formed along the sacrificial logic gate and the control gate. FIG. 7 illustrates some embodiments of a cross-sectional view 700 corresponding to act 1606.

At 1608, the inter-poly dielectric layer and the floating gate layer within the memory region are patterned to form a memory gate stack together with the control gate electrodes. FIG. 8 illustrates some embodiments of a cross-sectional view 800 corresponding to act 1608.

At 1610, select gate electrodes and an erase gate electrode are formed alongside the memory gate stack. In some embodiments, a common source/drain region is formed between opposing sides of the memory gate stacks within the substrate. A common source/drain dielectric and a tunneling dielectric layer are formed on the common source/drain region along the opposing sides of the floating gates. A select gate dielectric, select gates and a select gate spacer are subsequently formed at opposite sides of the memory gate stacks. Further, a contact etch stop layer is formed over the substrate, a first inter-level dielectric layer is formed over the contact etch stop layer, and a first planarization is performed. The sacrificial logic gate electrode within the logic region is exposed. FIGS. 9-13 illustrate some embodiments of cross-sectional views corresponding to act 1610.

At 1612, the sacrificial logic gate electrode is removed and trenches are formed between the select gate spacer within the logic region. FIG. 14 illustrates some embodiments of a cross-sectional view 1400 corresponding to act 1612.

At 1614, a replacement gate process is subsequently performed by forming a high-k gate dielectric layer and metal materials within the trenches. In some embodiments, the memory gate dielectric layer within the trenches can be removed and replaced by a logic gate dielectric. FIG. 15 illustrates some embodiments of a cross-sectional view 1500 corresponding to act 1614.

FIGS. 17-25 illustrate a series of cross-sectional views 1700-2500 of some embodiments of a method for manufacturing an IC comprising a HKMG NVM device.

Figure 17:
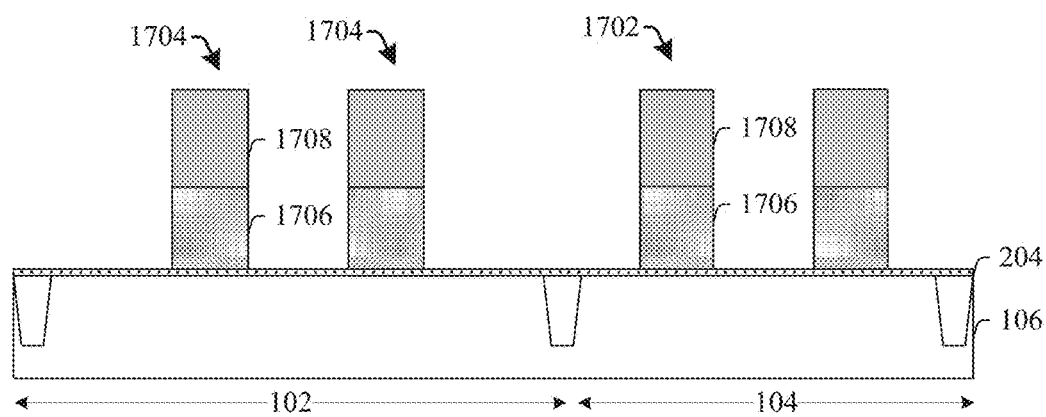
FIGS. 17-25 illustrate a series of cross-sectional views of some additional embodiments of a method for manufacturing an IC comprising a HKMG NVM device.

As shown in cross-sectional view 1700 of FIG. 17, a substrate 106 is provided including a memory region 102 and an adjacent logic region 104. A memory gate dielectric 204 is formed over the substrate 106. A select gate layer 1706 and a hard mask layer 1708 are formed and patterned over the memory gate dielectric 204 to form a pair of select gate stacks 1704 within the memory region 102 and a sacrificial logic gate stack 1702 within the logic region 104. The memory gate dielectric layer 204 can be an oxide, such as silicon dioxide, or other high-k dielectric materials. In some embodiments, the select gate layer 1706 and the hard mask layer 1708 are formed by using a deposition technique (e.g., PVD, CVD, PE-CVD, ALD, etc.), and patterned by performing a photolithography process followed by one or more subsequent etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.).

Figure 18:
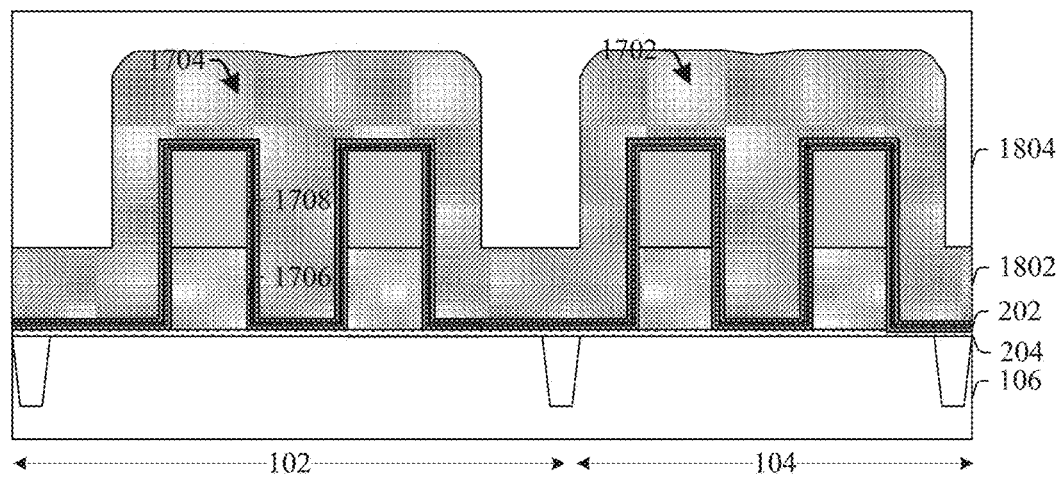

As shown in cross-sectional view 1800 of FIG. 18, a conformal charge trapping layer 202 is formed on the upper surface of the hard mask layer 1708, along hard mask sidewalls and select gate sidewalls, and over the upper surface of the substrate 106. In some embodiments, the conformal charge trapping layer 202 can be formed by plasma enhanced chemical vapor deposition (PECVD), and can be made up of multiple layers, such as a charge trapping component sandwiched between two dielectric layers. In some embodiments, the charge trapping layer 202 comprises a first oxide layer, a nitride layer, and a second oxide layer or, which can be referred to as an oxide-nitride-oxide (ONO) structure. In some other embodiments, the charge trapping layer 202 comprises a first oxide layer, a layer of silicon dots, and a second oxide layer. A control gate layer 1802 is then formed over the conformal charge trapping layer 202. In some embodiments, the control gate layer 1802 comprises a conductive material, for example, polysilicon or metal. In some embodiments, an antireflective layer 1804 is then formed over the control gate layer 1802 to fill gaps and formed a planar upper surface. The antireflective layer 1804 can be one or multiple layers of inorganic or organic films, formed by either a deposition or a spin-on process followed by a planarization process.

Figure 19:
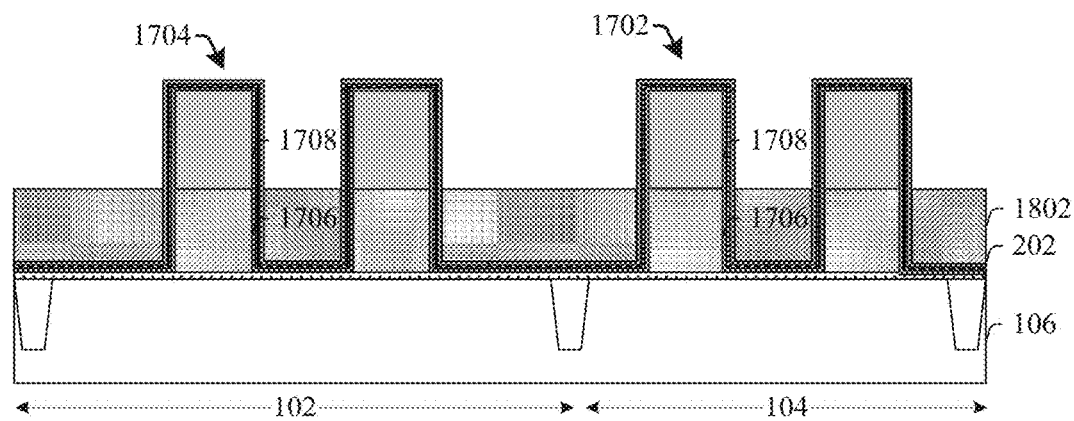

As shown in cross-sectional view 1900 of FIG. 19, the control gate layer 1802 and the antireflective layer 1804 are etched back to remove an upper portion of the control gate layer 1802 and to form a planar upper surface of the control gate layer 1802 locates at the substantially same lateral plane of a top surface of the select gate layer 1706. In some embodiments, an upper sidewall of the conformal charge trapping layer 202 is exposed. In some embodiments, an upper portion of the charge trapping component may be removed as well during the etching back process.

Figure 20:
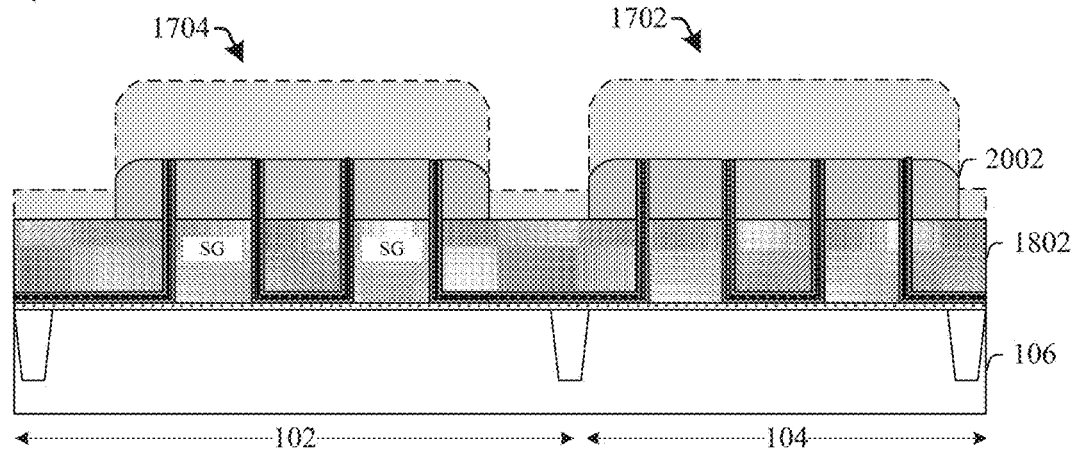

As shown in cross-sectional view 2000 of FIG. 20, a pair of cap spacers 2002 is formed over the remaining portions of the control gate layer 1802 along an upper sidewall of the conformal charge trapping layer 202. In some embodiments, a conformal dielectric layer, shown by broken line, is firstly formed along the topology and then etched to a top surface of the control gate layer 1802, forming the pair of cap spacers 2002. In some embodiments, a dielectric liner (not shown) can be formed from the top surface of the control gate layer 1802 extending to the upper sidewall of the charge trapping layer 202 and cover upper surfaces of the hard mask layer 1708 before forming the pair of cap spacers 2002. The dielectric liner can act as an etch stop layer with relative high selectivity and enhance adhesion of the cap spacers 2002. As an example, the dielectric layer can be made of silicon nitride and the dielectric liner can be made of silicon oxide.

Figure 21:
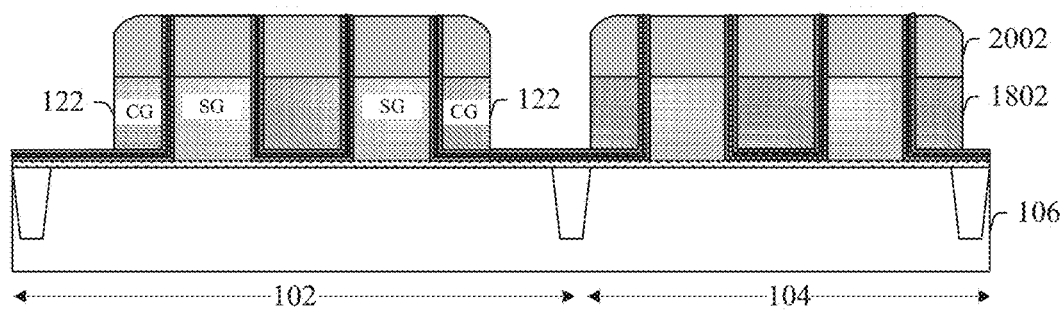

As shown in cross-sectional view 2100 of FIG. 21, a portion of the control gate layer 1802 not covered by the pairs of cap spacers 2002 is removed to form a pair of control gate electrodes 122 corresponding to a remaining portion of the control gate layer 1802. In some embodiments, the control gate layer 1802 is patterned self-aligned, i.e., according to the cap spacers 2002 as a "mask layer". In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$). Outer sidewalls of the control gate electrodes 122 and the pair of cap spacers 2002 are aligned.

Figure 22:
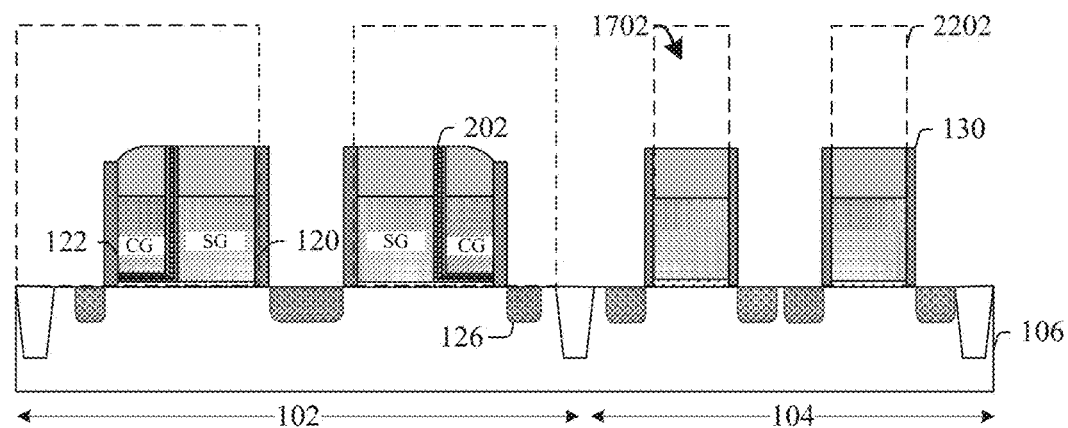

As shown in cross-sectional view 2200 of FIG. 22, a portion of the control gate layer 1802 and a portion of the charge trapping layer 202 located at inner sides of the pair of select gates are selectively removed with a mask 2202 (e.g., a photoresist mask) in place. Portions of the control gate layer 1802 and the charge trapping layer 202 within the logic region 104 are also removed. In some embodiments, the removed portions are etched off using wet etching in order to protect the substrate 106 from damaging. In some embodiments, source/drain regions 126 are formed subsequently in the substrate 106. The source/drain regions 126 are arranged between inner sidewalls of the pair of the select gate electrodes 120 and about outer sidewalls of the pair of the control gate electrodes 122. A sidewall spacer 130 is formed along the control gate electrodes 122 and the select gate electrodes 120 within the memory region 102 and along the sacrificial logic gate stacks 1702 within the logic region 104. In some embodiments, the sidewall spacer 130 may comprise an oxide (e.g., $SiO_2$) or a nitride (e.g., SiN) formed by a deposition process. The sidewall spacer 130 may be formed directly on an upper surface of the substrate 106.

Figure 23:
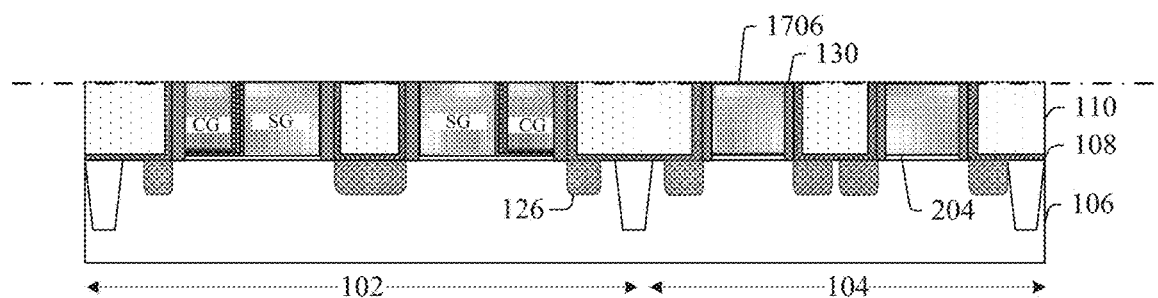

As shown in cross-sectional view 2300 of FIG. 23, a conformal contact etch stop layer 108 is formed over the source/drain regions 126 and extends along the sidewall spacer 130. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. The sacrificial select gate layer 1706 may be exposed after the first planarization process.

Figure 24:
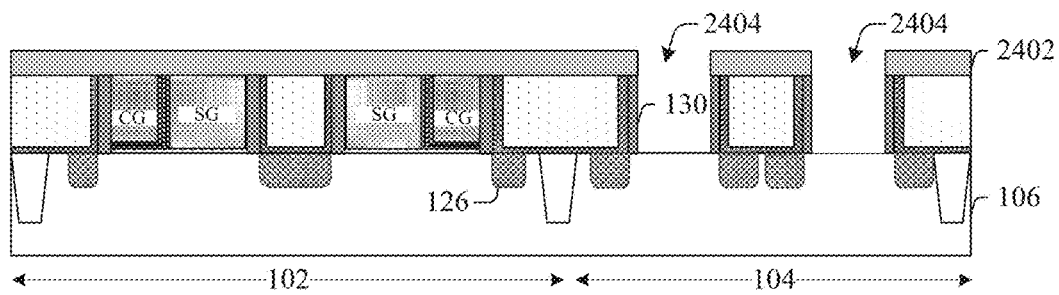

As shown in cross-sectional view 2400 of FIG. 24, a hard mask 2402 is formed to cover the memory region 102 and to expose the sacrificial select gate layer 1706 within the logic region 104. The sacrificial select gate layer 1706 (shown in FIG. 23) is then removed, resulting in the formation of trenches 2404 between the sidewall spacer 130.

Figure 25:
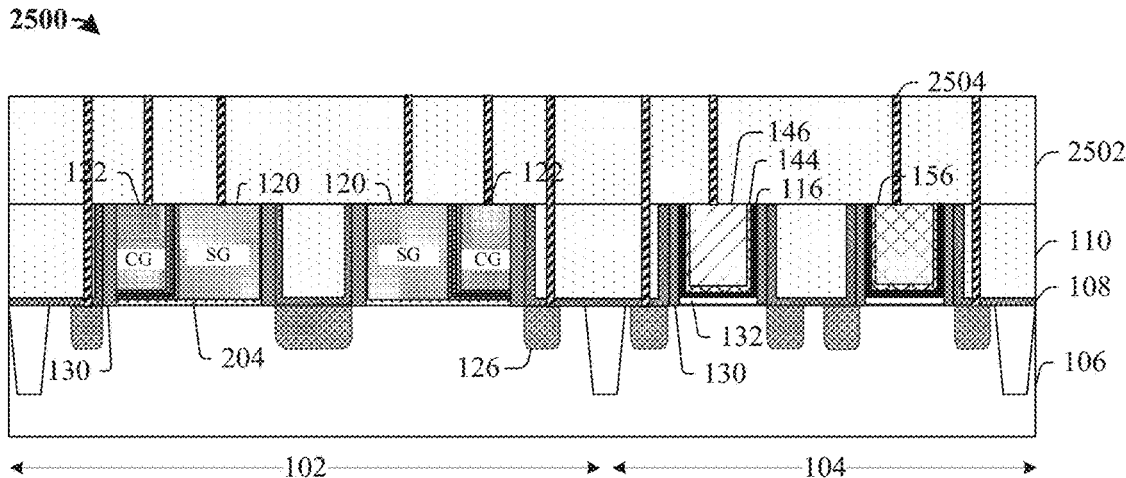

As shown in cross-sectional view 2500 of FIG. 25, a high-k gate dielectric layer 116, a barrier layer 144 and metal gate materials (e.g. 146, 156) are formed over the first inter-layer dielectric layer 110 and/or the hard mask 2402 and filled into the trenches 2404 of FIG. 24 through a series of deposition processes (e.g., chemical vapor deposition, physical vapor deposition, etc.). The barrier layer 144 can be formed in conformal and comprise metal materials such as titanium (Ti), tantalum (Ta), zirconium (Zr), or their alloys, for example. A series of deposition and etching processes can be performed that form different metal compositions within the trenches 2404 for different devices or different components of the same devices, to achieve desired work functions. In some embodiments, the memory gate dielectric layer 204 within the sacrificial logic gate stacks (shown in FIG. 23) can be removed and replaced by a logic gate dielectric 132. Still shown in FIG. 25, a second inter-layer dielectric layer 2502 can be formed overlying the first inter-layer dielectric layer 110. Contacts 2504 can be formed through the second inter-layer dielectric layer and the first inter-layer dielectric layer 110. The contacts may be formed by selectively etching the second inter-layer dielectric layer to form openings (e.g. with a patterned photoresist mask in place), and by subsequently depositing a conductive material within the openings. In some embodiments, the conductive material may comprise tungsten (W) or titanium nitride (TiN), for example.

Figure 26:
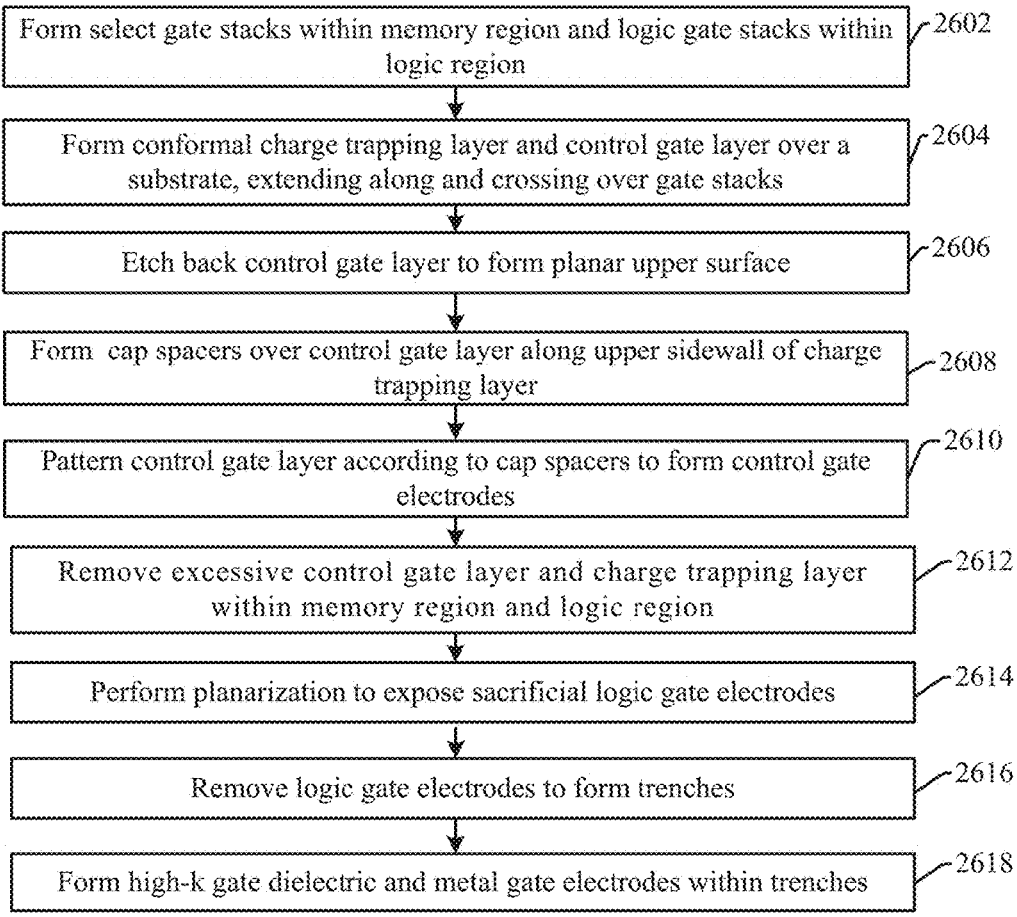
FIG. 26 illustrates a flow diagram of some additional embodiments of a method for manufacturing an IC comprising a HKMG NVM device.

FIG. 26 illustrates a flow diagram of some embodiments of a method 2600 for manufacturing an IC comprising a HKMG NVM device.

Although method 2600 is described in relation to FIGS. 17-25, it will be appreciated that the method 2600 is not limited to such structures, but instead may stand alone as a method independent of the structures. Furthermore, while the disclosed methods (e.g., method 2600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2602, select gate stacks are formed within a memory region and logic gate stacks are formed within an adjacent logic region over a substrate. Each of the select gate stacks may include a select gate electrode and a hard mask. Each of the logic gate stacks may include a sacrificial logic gate electrode and a hard mask. FIG. 17 illustrates some embodiments of a cross-sectional view 1700 corresponding to act 2602.

At 2604, a conformal charge trapping layer and a control gate layer are formed over the substrate, extending along sidewalls and crossing over upper surfaces of the logic gate stacks and the select gate stacks. FIG. 18 illustrates some embodiments of a cross-sectional view 1800 corresponding to act 2604.

At 2606, the control gate layer is etched back, and a planar upper surface is formed. FIG. 19 illustrates some embodiments of a cross-sectional view 1900 corresponding to act 2606.

At 2608, a cap spacer is formed over the control gate layer along an upper sidewall of the charge trapping layer. FIG. 20 illustrates some embodiments of a cross-sectional view 2000 corresponding to act 2608.

At 2610, the control gate layer is patterned according to the cap spacer to form control gate electrodes. FIG. 21 illustrates some embodiments of a cross-sectional view 2100 corresponding to act 2610.

At 2612, excessive portions of the control gate layer and the charge trapping layer between inner sides of a pair of select gate stacks are removed together with portions within the logic region. FIG. 22 illustrates some embodiments of a cross-sectional view 2200 corresponding to act 2612.

At 2614, an etch stop layer and an inter-layer dielectric layer are formed between the memory region and the logic region. A planarization is performed, and the sacrificial logic gate electrode within the logic region is exposed. FIG. 23 illustrates some embodiments of a cross-sectional view 2300 corresponding to act 2614.

At 2616, the sacrificial logic gate electrode is removed, and a trench is formed within the logic region. FIG. 24 illustrates some embodiments of a cross-sectional view 2400 corresponding to act 2616.

At 2618, a replacement gate process is subsequently performed by forming a high-k gate dielectric layer and metal materials within the trenches. In some embodiments, the memory gate dielectric layer within the trenches can be removed and replaced by a logic gate dielectric. FIG. 25 illustrates some embodiments of a cross-sectional view 2500 corresponding to act 2618.

FIGS. 27-36 illustrate a series of cross-sectional views 2700-3600 of some embodiments of a method for manufacturing an IC comprising a HKMG NVM device.

Figure 27:
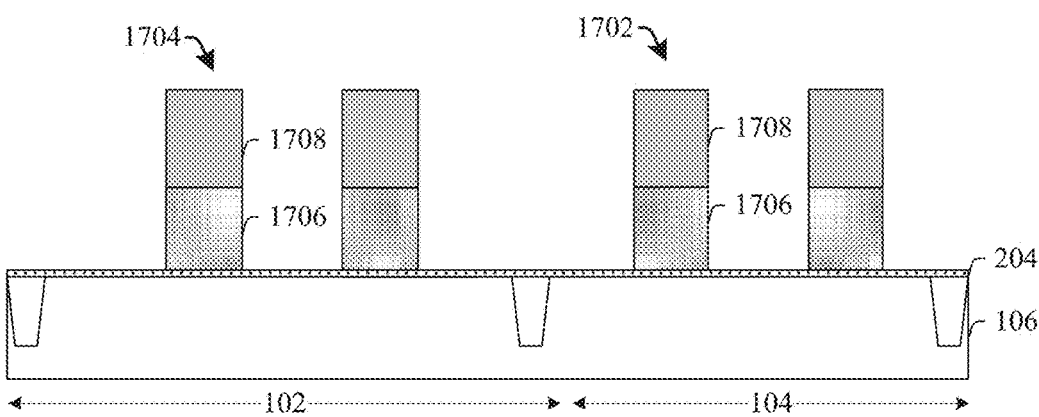
FIGS. 27-36 illustrate a series of cross-sectional views of some additional embodiments of a method for manufacturing an IC comprising a HKMG NVM device.

As shown in cross-sectional view 2700 of FIG. 27, a substrate 106 is provided including a memory region 102 and an adjacent logic region 104. A memory gate dielectric 204 is formed over the substrate 106. A select gate layer 1706 and a hard mask layer 1708 are formed and patterned over the memory gate dielectric 204 to form a pair of select gate stacks 1704 within the memory region 102 and a sacrificial logic gate stack 1702 within the logic region 104. The memory gate dielectric layer 204 can be an oxide, such as silicon dioxide, or other high-k dielectric materials. In some embodiments, the select gate layer 1706 and the hard mask layer 1708 are formed by using a deposition technique (e.g., PVD, CVD, PE-CVD, ALD, etc.), and patterned by performing a photolithography process followed by one or more subsequent etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.).

Figure 28:
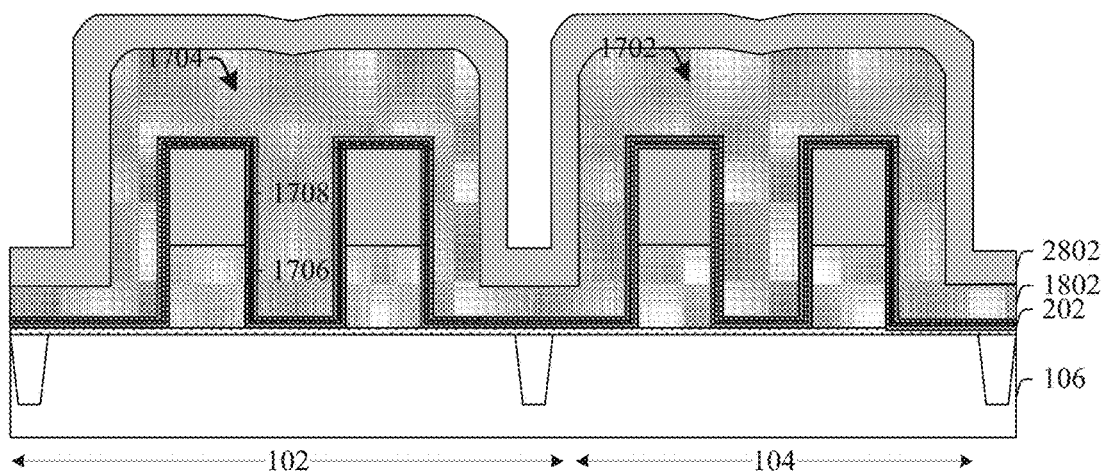

As shown in cross-sectional view 2800 of FIG. 28, a conformal charge trapping layer 202 is formed on the upper surface of the hard mask layer 1708, along the hard mask sidewalls, along select gate sidewalls, and over the upper surface of the substrate 106. In some embodiments, the conformal charge trapping layer 202 can be formed by plasma enhanced chemical vapor deposition (PECVD), and can be made up of multiple layers, such as a charge trapping component sandwiched between two dielectric layers. In some embodiments, the charge trapping layer 202 comprises a first oxide layer, a nitride layer, and a second oxide layer or, which can be referred to as an oxide-nitride-oxide (ONO) structure. In some other embodiments, the charge trapping layer 202 comprises a first oxide layer, a layer of silicon dots, and a second oxide layer. A control gate layer 1802 and a cap spacer layer 2802 are then formed over the conformal charge trapping layer 202. In some embodiments, the control gate layer 1802 comprises a conductive material, for example, doped silicon or metal. The cap spacer layer 2802 comprises a dielectric layer, for example, silicon nitride. In some embodiments, the control gate layer 1802 and the cap spacer layer 2802 are formed by way of a deposition process (e.g., CVD, PVD, etc.).

Figure 29:
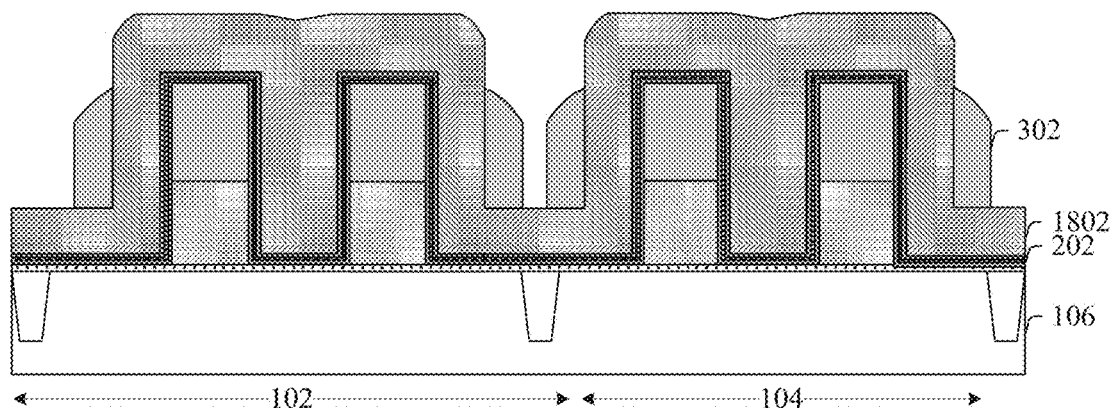

As shown in cross-sectional view 2900 of FIG. 29, the cap spacer layer 2802 is etched to form a pair of cap spacers 302 over a lower lateral portion of the control gate layer 1802 along a sidewall of the control gate layer 1802.

Figure 30:
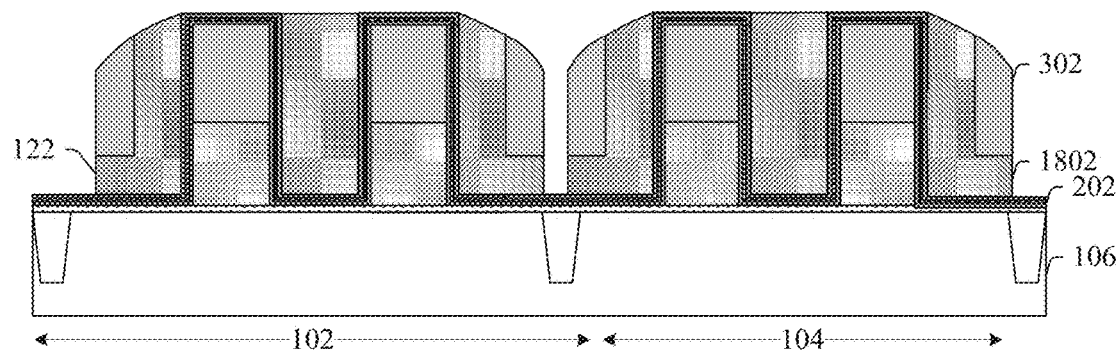

As shown in cross-sectional view 3000 of FIG. 30, the control gate layer 1802 is etched back with the pairs of cap spacers 302 in place to form a pair of control gate electrodes 122 corresponding to a remaining portion of the control gate layer 1802. In some embodiments, the control gate layer 1802 is patterned self-aligned, i.e., according to the cap spacers 302 as a "mask layer". In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$). Lower sidewalls of the control gate electrodes 122 and the pair of cap spacers 302 are aligned.

Figure 31:
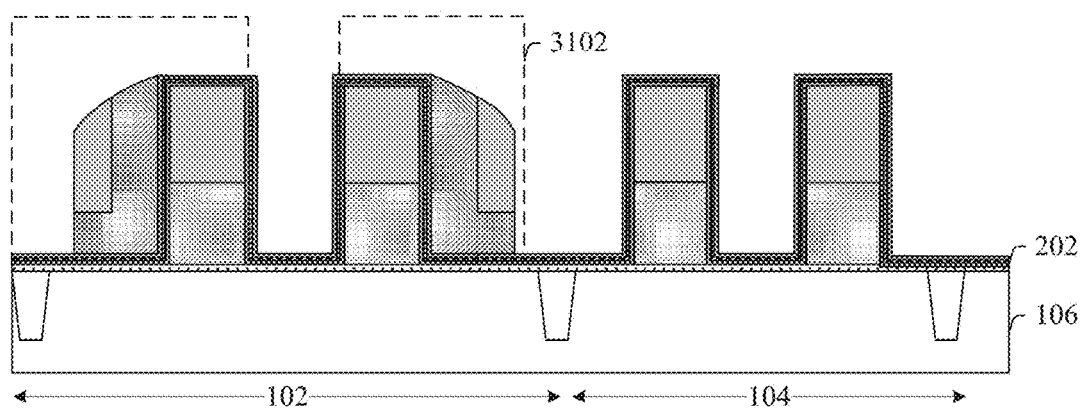

As shown in cross-sectional view 3100 of FIG. 31, a portion of the control gate layer 1802 (shown in FIG. 30) and a portion of the charge trapping layer 202 located at inner sides of the pair of select gate stacks are selectively removed with a mask 3102 (e.g., a photoresist mask) in place. Portions of the control gate layer 1802 and the charge trapping layer 202 within the logic region 104 are also removed. In some embodiments, the removed portions are etched off using wet etching or dry etching processes.

Figure 32:
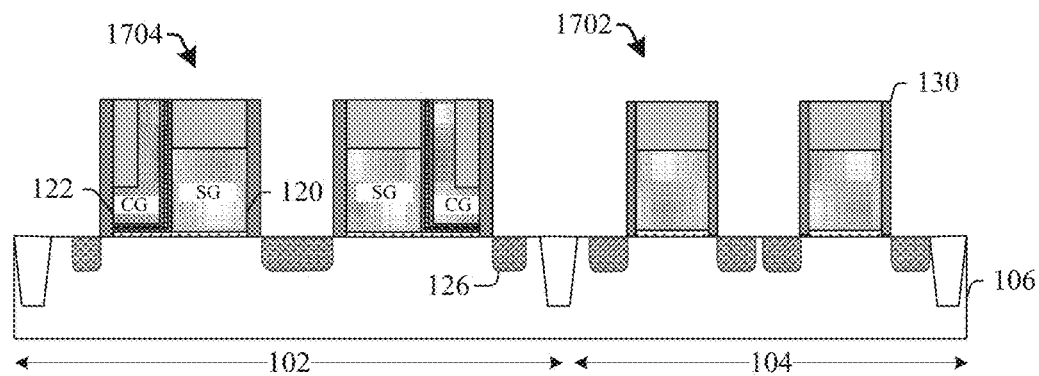

As shown in cross-sectional view 3200 of FIG. 32, a sidewall spacer 130 is formed along the control gate electrodes 122 and the select gate stacks 1704 within the memory region 102 and along the sacrificial logic gate stacks 1702 within the logic region 104. In some embodiments, the sidewall spacer 130 may comprise an oxide (e.g., $SiO_2$) or a nitride (e.g., SiN) formed by a deposition process. Source/drain regions 126 are formed alongside the sidewall spacer 130 within the substrate 106. The source/drain regions 126 are arranged between inner sidewalls of the pair of the select gate electrodes 120 and about outer sidewalls of the pair of the control gate electrodes 122.

Figure 33:
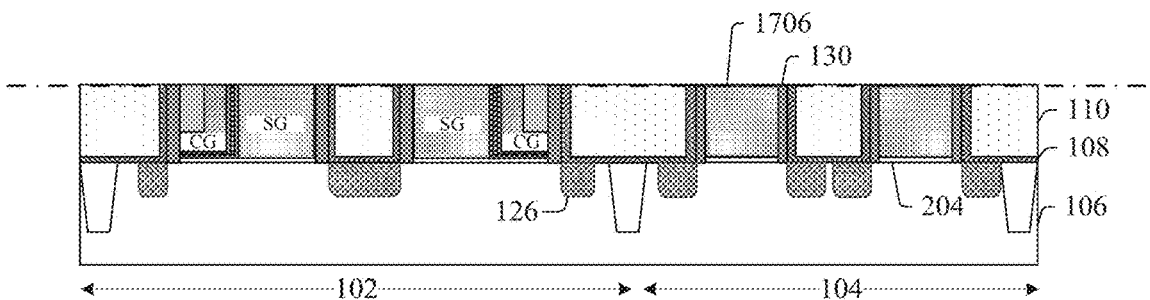

As shown in cross-sectional view 3300 of FIG. 33, a conformal contact etch stop layer 108 is formed over the source/drain regions 126 and extends along the sidewall spacer 130. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. The sacrificial select gate layer 1706 may be exposed after the first planarization process.

Figure 34:
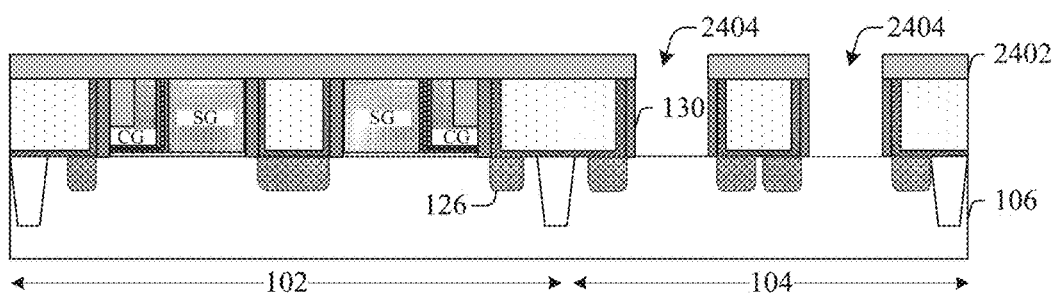

As shown in cross-sectional view 3400 of FIG. 34, a hard mask 2402 is formed to cover the memory region 102 and to expose the sacrificial select gate layer 1706 within the logic region 104. The sacrificial select gate layer 1706 (shown in FIG. 33) is then removed, resulting in the formation of trenches 2404 between the sidewall spacer 130.

Figure 35:
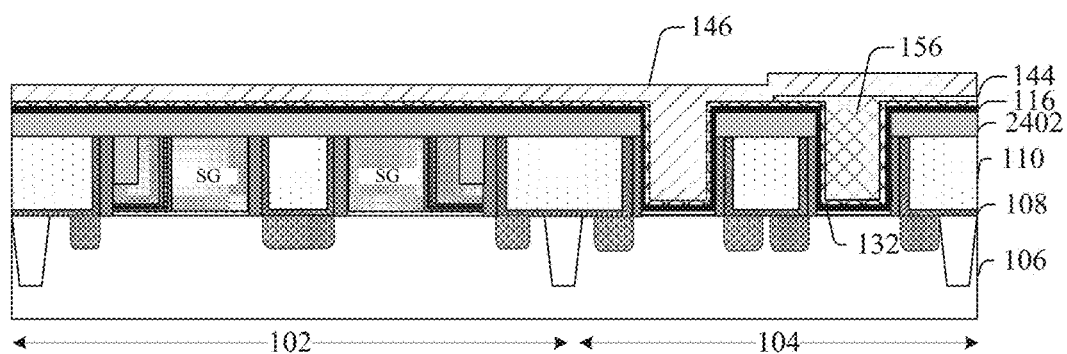

As shown in cross-sectional view 3500 of FIG. 35, a high-k gate dielectric layer 116, a barrier layer 144 and metal gate materials (e.g. 146, 156) are formed over the first inter-layer dielectric layer 110 and/or the hard mask 2402 and filled into the trenches 2404 of FIG. 24 through a series of deposition processes (e.g., chemical vapor deposition, physical vapor deposition, etc.). The barrier layer 144 can be formed in conformal and comprise metal materials such as titanium (Ti), tantalum (Ta), zirconium (Zr), or their alloys, for example. A series of deposition and etching processes can be performed that form different metal compositions within the trenches 2404 for different devices or different components of the same devices, to achieve desired work functions. In some embodiments, the memory gate dielectric layer 204 within the sacrificial logic gate stacks (shown in FIG. 33) can be removed and replaced by a logic gate dielectric 132.

Figure 36:
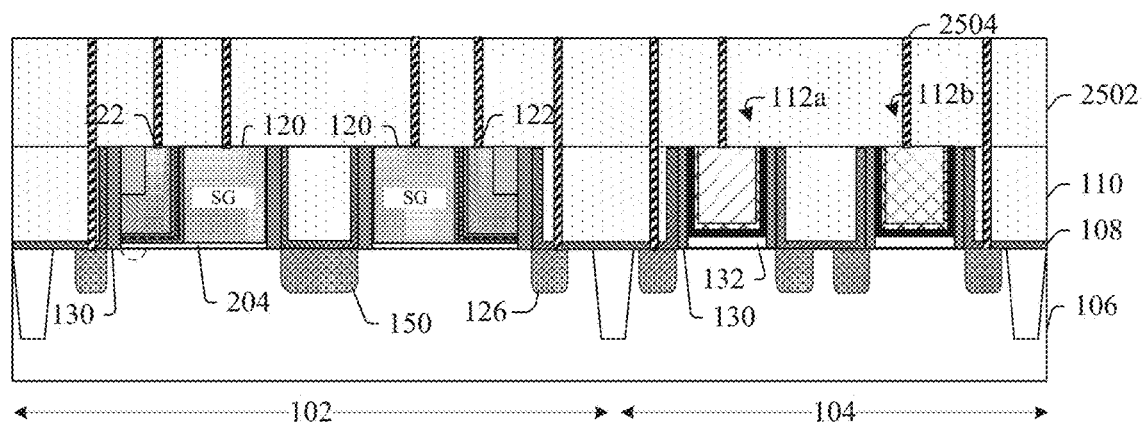

As shown in cross-sectional view 3600 of FIG. 36, a second inter-layer dielectric layer 2502 can be formed overlying the first inter-layer dielectric layer 110. Contacts 2504 can be formed through the second inter-layer dielectric layer and the first inter-layer dielectric layer 110 to reach on logic transistors 112a, 112b within the logic region 104, the select gate electrodes 120 and the control gate electrodes 122 within the memory region 102, and the source/drain regions 126. The contacts 2504 may be formed by selectively etching the second inter-layer dielectric layer to form openings (e.g. with a patterned photoresist mask in place), and by subsequently depositing a conductive material within the openings. In some embodiments, the conductive material may comprise tungsten (W) or titanium nitride (TiN), for example.

Figure 37:
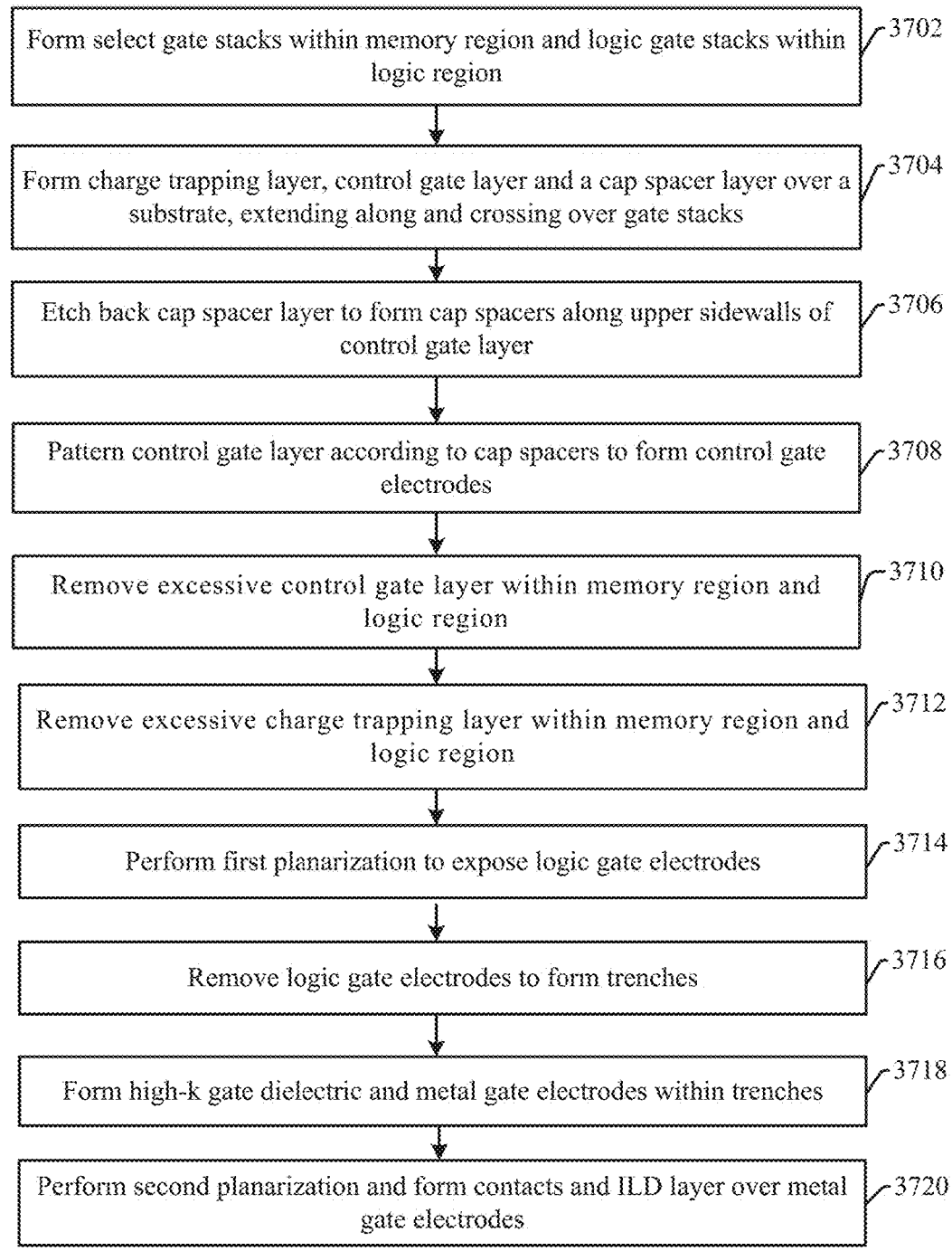
FIG. 37 illustrates a flow diagram of some additional embodiments of a method for manufacturing an IC comprising a HKMG NVM device.

FIG. 37 illustrates a flow diagram of some embodiments of a method 3700 for manufacturing an IC comprising a HKMG NVM device.

Although method 3700 is described in relation to FIGS. 27-36, it will be appreciated that the method 3700 is not limited to such structures, but instead may stand alone as a method independent of the structures. Furthermore, while the disclosed methods (e.g., method 3700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3702, select gate stacks are formed within a memory region and logic gate stacks are formed within an adjacent logic region over a substrate. Each of the select gate stacks may include a select gate electrode and a hard mask. Each of the logic gate stacks may include a sacrificial logic gate electrode and a hard mask. FIG. 27 illustrates some embodiments of a cross-sectional view 2700 corresponding to act 3702.

At 3704, a conformal charge trapping layer, a control gate layer, and a cap spacer layer are formed over the substrate, extending along sidewalls and crossing over upper surfaces of the logic gate stacks and the select gate stacks. FIG. 28 illustrates some embodiments of a cross-sectional view 2800 corresponding to act 3704.

At 3706, the cap spacer layer is etched back, and a cap spacer is formed over the control gate layer along an upper sidewall of the control gate layer. FIG. 29 illustrates some embodiments of a cross-sectional view 2900 corresponding to act 3706.

At 3708, the control gate layer is patterned according to the cap spacer, to form control gate electrodes. FIG. 30 illustrates some embodiments of a cross-sectional view 3000 corresponding to act 3708.

At 3710, excessive portions of the control gate layer between inner sides of the pair of select gate stacks are removed together with portions within the logic region. FIG. 31 illustrates some embodiments of a cross-sectional view 3100 corresponding to act 3710.

At 3712, excessive portions of the charge trapping layer between inner sides of the pair of select gate stacks are removed together with portions within the logic region. A sidewall spacer is formed along the control gate electrodes and the select gate stacks within the memory region and along the sacrificial logic gate stacks within the logic region. FIG. 32 illustrates some embodiments of a cross-sectional view 3200 corresponding to act 3712.

At 3714, an etch stop layer and an inter-layer dielectric layer are formed between the memory region and the logic region. A planarization is performed, and the sacrificial logic gate electrode within the logic region is exposed. FIG. 33 illustrates some embodiments of a cross-sectional view 3300 corresponding to act 3714.

At 3716, the sacrificial logic gate electrode is removed, and a trench is formed within the logic region. FIG. 34 illustrates some embodiments of a cross-sectional view 3400 corresponding to act 3716.

At 3718, a replacement gate process is subsequently performed by forming a high-k gate dielectric layer and metal materials within the trenches. In some embodiments, the memory gate dielectric layer within the trenches can be removed and replaced by a logic gate dielectric. FIG. 35 illustrates some embodiments of a cross-sectional view 3500 corresponding to act 3718.

At 3720, a second planarization is performed and metal gate electrodes are formed within the logic region. A second inter-level dielectric layer and contacts are formed over the first inter-level dielectric layer. FIG. 36 illustrates some embodiments of a cross-sectional view 3600 corresponding to act 3720.

Therefore, the present disclosure relates to an integrated circuit (IC) that comprises a high-k metal gate (HKMG) non-volatile memory (NVM) device and that provides small scale and high performance, and a method of formation.

In some embodiments, the present disclosure relates to an integrated circuit. The integrated circuit comprises a memory region comprising a non-volatile memory (NVM) device having a pair of a control gate electrode and a select gate electrode disposed between two neighboring source/drain regions over a substrate. The control gate electrode and the select gate electrode comprise polysilicon. The integrated circuit further comprises a logic region disposed adjacent to the memory region and comprising a logic device including a metal gate electrode disposed between two neighboring source/drain regions over a logic gate dielectric and having bottom and sidewall surfaces covered by a high-k gate dielectric layer.

In other embodiments, the present disclosure relates to present disclosure relates to a method of forming an integrated circuit. The method comprises providing a substrate comprising a memory region and a logic region adjacent to the memory region and forming a sacrificial logic gate electrode within the logic region together with a control gate electrode or a select gate electrode within the memory region by patterning a control gate layer or a select gate layer. The method further comprises forming a first inter-layer dielectric layer between the sacrificial logic gate electrode and the control gate electrode or the select gate electrode and forming a hard mask over the first inter-layer dielectric layer to cover the memory region and to expose the sacrificial logic gate electrode within the logic region. The method further comprises replacing the sacrificial logic gate electrode with a high-k gate dielectric layer and a metal layer to form a metal gate electrode within the logic region.

In yet other embodiments, the present disclosure relates to a method of forming an integrated circuit. The method comprises providing a substrate comprising a memory region and a logic region adjacent to the memory region and forming a gate dielectric layer over the substrate. The method further comprises forming and patterning a select gate layer over the gate dielectric layer to form a select gate electrode within the memory region and a sacrificial logic gate electrode within the logic region and forming a conformal charge trapping layer over an upper surface of the substrate, extending upwardly along sidewalls of the select gate electrode and the sacrificial logic gate electrode, and crossing over a top surface of the select gate electrode and the sacrificial logic gate electrode. The method further comprises forming a control gate layer over the conformal charge trapping layer and forming a cap spacer over the control gate layer along an upper sidewall of the charge trapping layer. The method further comprises removing a portion of the control gate layer not covered by the cap spacer, thereby forming a control gate electrode at one side of the select gate electrode and replacing the sacrificial logic gate electrode with a high-k gate dielectric layer and a metal layer to form a metal gate electrode within the logic region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC), comprising:
   providing a substrate comprising a memory region and a logic region adjacent to the memory region;
   forming a memory gate dielectric layer over the substrate;
   forming a select gate layer over the memory gate dielectric layer in logic region and the memory region;
   concurrently removing a portion of the select gate layer from both the logic region and the memory region to form a sacrificial logic gate electrode in the logic region and a select gate electrode in the memory region;
   forming a control gate layer over a conformal charge trapping layer;
   forming an antireflective layer over the control gate layer to fill gaps and form a planar upper surface;
   performing an etch back process to the antireflective layer and the control gate layer to form and expose a planar top surface of the control gate layer;
   patterning the control gate layer to forming a control gate electrode at one side of the select gate electrode;
   patterning the memory gate dielectric layer according to the select gate electrode, the control gate electrode, and the sacrificial logic gate electrode;
   forming a first inter-layer dielectric layer between the sacrificial logic gate electrode and the select gate electrode;
   forming a hard mask over the first inter-layer dielectric layer to cover the memory region and to expose the sacrificial logic gate electrode within the logic region; and
   replacing the sacrificial logic gate electrode with a high-k gate dielectric layer and a metal layer to form a metal gate electrode within the logic region.

2. The method of claim 1, further comprising:
   forming the conformal charge trapping layer to extend over an upper surface of the substrate, to extend upwardly along sidewalls of the select gate electrode and the sacrificial logic gate electrode, and to crossover a top surface of the select gate electrode and the sacrificial logic gate electrode.

3. The method of claim 2, further comprising:
   forming a cap spacer over the planar top surface of the control gate layer along an upper sidewall of the conformal charge trapping layer; and wherein the control gate electrode is formed by removing a portion of the control gate layer not covered by the cap spacer.

4. The method of claim 3, wherein the cap spacer is formed by forming a conformal dielectric material followed by an etching process.

5. The method of claim 3, wherein the planar top surface of the control gate layer is substantially aligned with a top surface of the select gate electrode.

6. The method of claim 3, further comprising:
forming a sidewall spacer alongside outer sidewalls of the select gate electrode and the control gate electrode and sidewalls of the sacrificial logic gate electrode; and
forming a contact etch stop layer having a 'U' shaped structure including vertical components abutting the sidewall spacer and connected by a planar lateral component formed along an upper surface of the substrate.

7. The method of claim 6, further comprising:
forming a hard mask to cover the memory region and to expose the sacrificial logic gate electrode within the logic region; and
performing an etch to remove the exposed sacrificial logic gate electrode, leaving a trench between the sidewall spacers; and
forming a logic gate dielectric on a bottom surface of the trench;
conformally forming the high-k gate dielectric layer over the logic gate dielectric and along trench sidewalls; and
filling the metal layer within remaining space of the trench; and
performing a planarization of the metal layer to form the metal gate electrode within the logic region.

8. The method of claim 1, wherein the memory region is disposed between a first isolation structure and a second isolation structure, wherein the logic region is disposed between the second isolation structure and a third isolation structure, and wherein outer sidewalls of the sacrificial logic gate electrode are disposed between the second isolation structure and the third isolation structure.

9. A method of forming an integrated circuit (IC), comprising:
providing a substrate comprising a memory region and a logic region adjacent to the memory region;
forming a gate dielectric layer over the substrate;
forming and patterning a select gate layer over the gate dielectric layer to concurrently form a select gate electrode within the memory region and a sacrificial logic gate electrode within the logic region;
forming a conformal charge trapping layer extending over an upper surface of the substrate, extending upwardly along sidewalls of the select gate electrode and the sacrificial logic gate electrode, and crossing over a top surface of the select gate electrode and the sacrificial logic gate electrode;
forming a control gate layer over the conformal charge trapping layer;
forming a cap spacer over the control gate layer and along an upper sidewall of the conformal charge trapping layer, wherein the cap spacer has an upper surface that is substantially aligned with an upper surface of the conformal charge trapping layer;
after forming the cap spacer, removing a portion of the control gate layer not covered by the cap spacer, thereby forming a control gate electrode at one side of the select gate electrode;
patterning the gate dielectric layer according to the select gate electrode, the control gate electrode, and the sacrificial logic electrode; and
replacing the sacrificial logic gate electrode with a high-k gate dielectric layer and a metal layer to form a metal gate electrode within the logic region.

10. The method of claim 9, wherein an etch back is performed on the control gate layer before forming the cap spacer, thereby forming a planar top surface of the control gate layer substantially aligned with a top surface of the select gate electrode.

11. The method of claim 9, further comprising:
forming an inter-layer dielectric layer between the sacrificial logic gate electrode and the control gate electrode; and
forming a hard mask over the inter-layer dielectric layer to cover the memory region and to expose the sacrificial logic gate electrode within the logic region.

12. A method of forming an integrated circuit (IC), comprising:
providing a substrate including a logic region and a memory region adjacent to the logic region;
forming a memory gate dielectric layer over the substrate;
depositing and patterning a first polysilicon layer over the memory gate dielectric layer to form a sacrificial logic gate electrode in the logic region for a logic device and a select gate electrode in the memory region for a non-volatile memory (NVM) device;
depositing and patterning a second polysilicon layer to form a control gate electrode at one side of the select gate electrode for the NVM device;
patterning the memory gate dielectric layer according to the select gate electrode, the control gate electrode, and the sacrificial logic gate electrode; and
removing and replacing the sacrificial logic gate electrode with a high-k gate dielectric layer and a metal layer to form a metal gate electrode within the logic region, wherein the high-k gate dielectric layer covers bottom and sidewall surfaces of the metal gate electrode;
wherein the memory gate dielectric layer is formed and patterned continuously extending under both the control gate electrode and the select gate electrode, wherein sidewalls of the memory gate dielectric are vertically aligned with outermost sidewalls of the control gate electrode and the select gate electrode; and
wherein after depositing the second polysilicon layer, an antireflective layer having a planar upper surface is formed over the second polysilicon layer, and an etching back process is performed to form and expose a planar upper surface of the second polysilicon layer prior to patterning the second polysilicon layer.

13. The method of claim 12, wherein the control gate electrode and the select gate electrode are formed to have cuboid shapes, which have planar upper surfaces aligned with an upper surface of the metal gate electrode.

14. The method of claim 12, further comprising:
forming a charge trapping layer separating opposing sidewalls of the control gate electrode and the select gate electrode, wherein the charge trapping layer laterally extends between the control gate electrode and the memory gate dielectric such that the charge trapping layer directly contacts a bottom surface of the control gate electrode and a top surface of the memory gate dielectric.

15. The method of claim 14, wherein the charge trapping layer is made as an oxide-nitride-oxide (ONO) structure.

16. The method of claim 14, wherein forming the charge trapping layer comprises:
  forming a first dielectric layer;
  forming a layer of sphere-like silicon dots over a surface of the first dielectric layer; and
  forming a second dielectric layer on the layer of sphere-like silicon dots.

17. The method of claim 12, further comprising:
  depositing a dielectric material over the second polysilicon layer;
  performing an etching process to the dielectric material to form a cap spacer along an upper sidewall of a charge trapping layer; and
  removing a portion of the second polysilicon layer not covered by the cap spacer, thereby forming the control gate electrode at one side of the select gate electrode.

18. The method of claim 17, further comprising:
  performing an etching process to remove the dielectric material and the charge trapping layer located at the other side of the select gate electrode opposite to the control gate electrode.

19. The method of claim 18, further comprising:
  forming a sidewall spacer on an upper surface of the substrate, having a first portion along outer sidewalls of the control gate electrode and the select gate electrode, and a second portion along sidewalls of the sacrificial logic gate electrode; and
  forming a contact etch stop layer between the logic region and the memory region with a 'U' shaped structure; and
  wherein the 'U' shaped structure has a first vertical component abutting the first portion of the sidewall spacer, a second vertical component abutting the second portion of the sidewall spacer, and a planar lateral component connecting the first vertical component and the second vertical component.

20. The method of claim 12, further comprising:
  prior to patterning the second polysilicon layer, forming a cap spacer on the planar upper surface of the second polysilicon layer along an upper sidewall of a charge trapping layer; and
  removing a portion of the second polysilicon layer not covered by the cap spacer, thereby forming the control gate electrode at one side of the select gate electrode.

* * * * *